(12) United States Patent
Watanabe

(10) Patent No.: US 8,039,310 B2
(45) Date of Patent: Oct. 18, 2011

(54) METHOD OF MANUFACTURING SEMICONDUCTOR DEVICE WITH IMPROVED DESIGN FREEDOM OF EXTERNAL TERMINAL

(75) Inventor: Kiyonori Watanabe, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 700 days.

(21) Appl. No.: 11/508,212

(22) Filed: Aug. 23, 2006

(65) Prior Publication Data

US 2006/0278973 A1   Dec. 14, 2006

Related U.S. Application Data

(62) Division of application No. 10/697,318, filed on Oct. 31, 2003, now Pat. No. 7,109,579.

(30) Foreign Application Priority Data

Nov. 8, 2002   (JP) ................................. 2002-325774

(51) Int. Cl.
   *H01L 21/52* (2006.01)
(52) U.S. Cl. ........................ 438/110; 438/125; 438/126
(58) Field of Classification Search ........... 438/110–113
   See application file for complete search history.

(56) References Cited

U.S. PATENT DOCUMENTS

| | | | |
|---|---|---|---|
| 4,989,063 A | 1/1991 | Kolesar, Jr. | |
| 5,870,289 A | 2/1999 | Tokuda et al. | |
| 6,013,948 A * | 1/2000 | Akram et al. | 257/698 |
| 6,154,366 A * | 11/2000 | Ma et al. | 361/704 |
| 6,220,764 B1 | 4/2001 | Kato et al. | |
| 6,222,259 B1 | 4/2001 | Park et al. | |
| 6,268,648 B1 | 7/2001 | Fukutomi et al. | |
| 6,271,469 B1 | 8/2001 | Ma et al. | |
| 6,320,267 B1 | 11/2001 | Yukawa et al. | |
| 6,423,570 B1 * | 7/2002 | Ma et al. | 438/106 |
| 6,455,920 B2 | 9/2002 | Fukasawa et al. | |
| 6,709,898 B1 * | 3/2004 | Ma et al. | 438/122 |
| 7,294,529 B2 * | 11/2007 | Tuominen | 438/107 |
| 2002/0192867 A1 | 12/2002 | Nishiyama | |
| 2003/0122244 A1 * | 7/2003 | Lin et al. | 257/700 |
| 2003/0230804 A1 * | 12/2003 | Kouno et al. | 257/734 |
| 2004/0046254 A1 * | 3/2004 | Lin et al. | 257/734 |
| 2004/0099955 A1 | 5/2004 | Shizuno | |

(Continued)

FOREIGN PATENT DOCUMENTS

JP          11-251493          9/1999

(Continued)

*Primary Examiner* — Wael Fahmy
*Assistant Examiner* — Abul Kalam
(74) *Attorney, Agent, or Firm* — Rabin & Berdo, PC

(57) ABSTRACT

A semiconductor method comprises a method for making a device comprising: a base; a semiconductor chip provided on the base which includes a first main surface 20a on which a plurality of electrode pads is provided, a surface protecting film provided on the first main surface, a second main surface which opposes the first main surface, and a plurality of side surfaces between the surface of the surface protecting film and the second main surface; an insulating extension portion formed so as to surround the side surfaces of the semiconductor chip; a plurality of wiring patterns electrically connected to the electrode pads, respectively and extended from the electrode pads to the surface of the extension portion; a sealing portion formed on the wiring patterns such that a part of each of the wiring patterns is exposed; and a plurality of external terminals provided on the wiring patterns in a region including the upper side of the extension portion.

4 Claims, 15 Drawing Sheets

U.S. PATENT DOCUMENTS

2004/0130022 A1 7/2004 Shizuno

FOREIGN PATENT DOCUMENTS

| | | |
|---|---|---|
| JP | 2000-124354 | 4/2000 |
| JP | 2000-208556 | 7/2000 |
| JP | 2000-277682 | 10/2000 |
| JP | 2001-308116 | 11/2001 |
| JP | 2002-016173 | 1/2002 |
| JP | 2002-231854 | 8/2002 |

* cited by examiner

METHOD OF MANUFACTURING SEMICONDUCTOR DEVICE WITH IMPROVED DESIGN FREEDOM OF EXTERNAL TERMINAL

This is a Divisional of U.S. Application Ser. No.: 10/697,318, filed on Oct. 31, 2003, the subject matter of which is incorporated herein by reference.

BACKGROUND OF THE INVENTION

1. Field of the Invention

This invention relates to a semiconductor device, and more particularly to a semiconductor device in which the degree of design freedom of an external terminal is increased in accordance with further increases in the number of external terminals.

2. Description of Related Art

Demands have been made in recent years for further reductions in the size and thickness of packaged semiconductor devices. In response to such demands, a packaging form known as a Wafer Level Chip Size Package (to be referred to simply as WCSP hereinafter), in which the external size of the packaging is substantially equal to the external size of the semiconductor chip, has been proposed.

A WCSP comprises a semiconductor chip. The semiconductor chip comprises a circuit element having a predetermined function and a plurality of electrode pads electrically connected to each other on the circuit element. An insulating film is formed on the surface of the semiconductor chip such that the plurality of electrode pads is exposed.

A plurality of wiring patterns connected to the exposed electrode pads is formed on the surface of the insulating film.

Electrode posts are formed on these wiring patterns. A sealing portion is then formed so as to cover the insulating film and wiring patterns and such that the top surface of the electrode posts is exposed.

A plurality of external terminals provided as solder balls used in BGA packaging, for example, is provided on the top surface of the electrode posts.

This type of WCSP has a so-called fan-in configuration in which the multiple external terminals are provided in a lattice formation, for example, in a region corresponding to a circuit-forming surface of the semiconductor chip.

As regards the mounting of the semiconductor chip comprising the external terminals in a fan-in configuration onto a printed board, Japanese Patent Application Laid-Open Publication No. 2000-208556 discloses a semiconductor device having the aim of preventing the breakage of a connecting portion between the printed board and external electrodes and comprising a semiconductor chip having electrode pads, wiring which is formed in a predetermined position on the semiconductor chip and connected to the electrode pads, external electrodes which are formed in a predetermined position on the wiring and connected to the wiring, a printed board connected to the external electrodes, and a substrate which is formed on the semiconductor chip. A resin layer is provided on the substrate for aligning the thermal expansion of the substrate and printed board, and in particular the external electrodes are provided on the resin layer.

As semiconductor devices become increasingly sophisticated, the number of external terminals formed on a single packaged semiconductor device is gradually increasing. Conventionally, such demands for increases in the number of external terminals have been met by providing constitutions in which the spacing between adjacent external terminals is narrowed. As shall be described below, however, design freedom is severely restricted by the disposal pitch and disposal positions of external terminals.

In the conventional WCSP described above, the minimum gap between adjacent external terminals is set at a concrete level of approximately 0.5 mm. In the case of a 7 mm×7 mm WCSP, the number of external terminals provided is approximately 160.

In accordance with demands for further increases in the number of external terminals on a packaged semiconductor device, it is desirable that approximately 300 external terminals be provided on a 7 mm×7 mm WCSP.

It is not technically impossible in the aforementioned WCSP to form an even larger number of external terminals on the surface of the WCSP by further narrowing the gap between adjacent external terminals.

However, it is extremely difficult to form 300 external terminals on the surface area of a 7 mm×7 mm WCSP. Moreover, if the intervals between the external terminals are narrowed, an extremely high degree of technology is required to mount the WCSP onto a mounting substrate.

For example, the intervals between the plurality of external terminals may have to be formed in alignment with the mounting pitch of the mounting substrate within a range of approximately 0.3 mm to 0.7 mm.

In a conventional packaging constitution in such a case, a semiconductor chip is connected to the substrate by means of a so-called flip chip connection and the semiconductor chip is connected to the external electrodes via the substrate. Alternatively, the substrate and semiconductor chip are connected by wire bonding and the semiconductor chip is connected to the external electrode via the substrate. Since both of these connection methods utilize a substrate, and since additional sealing material is required in accordance with the height of the wire loop, the package becomes thick. Moreover, the package becomes expensive due to the cost of the substrate. The package becomes particularly expensive when a flip chip connection is used since an expensive buildup substrate is required.

When connection is performed by means of wire bonding, the inductance of the wire part increases.

An object of this invention is therefore to provide a semiconductor device having a constitution in which design freedom in the disposal pitch and disposal positions of external terminals is increased and the package itself can be made compact.

SUMMARY OF THE INVENTION

In order to achieve this object, a semiconductor device of this invention has the following constitution. That is, the semiconductor device of this invention comprises a base and a semiconductor chip comprising a first main surface provided on the base and comprising a plurality of electrode pads, a surface protecting film formed such that the electrode pads on the first main surface are exposed, a second main surface which opposes the first main surface, and a plurality of side surfaces positioned between the surface of the surface protecting film and the second main surface.

An insulating extension portion is formed so as to surround the side surfaces of the semiconductor chip.

A plurality of wiring patterns is electrically connected to each of the electrode pads and extended from the electrode pads to the surface of the extension portion.

A sealing portion is formed on the wiring patterns such that a part of the wiring patterns is exposed.

A plurality of external terminals is provided on the wiring patterns in a region including the upper side of the extension portion.

According to the constitution of the semiconductor device of this invention, external terminals can also be provided in a region including the upper side of the extension portion which is provided surrounding the semiconductor chip, and thus a semiconductor device with increased design freedom in the disposal pitch, disposal positions, and so on of the external terminals can be provided. Moreover, by applying a so-called WCSP manufacturing process, the semiconductor device of this invention can be constituted without the use of an interposer such as a substrate. As a result, improvements in operational speed, functional sophistication, number of functions, and compactness can be achieved in comparison with a device in which a wire bonding connection is employed. Further, an equal electrical characteristic can be achieved at a lower cost than a device in which a flip-chip connection is employed.

Upon the implementation of this invention, a manufacturing method for a semiconductor device preferably comprises the following manufacturing processes.

A manufacturing method for a semiconductor device comprises:

(1) setting a plurality of semiconductor chip disposal regions, on which a plurality of semiconductor chips is to be disposed, at a predetermined pitch on a base;

(2) forming an extension portion from an insulating material in the regions other than the semiconductor chip disposal regions on the base;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface on the semiconductor chip disposal region such that the second main surface faces the semiconductor chip disposal region;

(4) forming wiring patterns which are extended from the electrode pads to a region including the upper side of the extension portion;

(5) forming a sealing portion on the wiring patterns such that a part of each of the wiring patterns in a region including the upper side of the extension portion is exposed;

(6) forming a plurality of external terminals over the wiring patterns in a region including the upper side of the extension portion; and (7) severing the plurality of semiconductor chips to form individual semiconductor devices comprising a semiconductor chip.

Further, a manufacturing method for a semiconductor device comprises the steps of:

(1) setting a plurality of semiconductor chip disposal regions, on which a plurality of semiconductor chips is to be disposed, at a predetermined pitch on a base;

(2) forming an extension portion from an insulating material in the regions other than the semiconductor chip disposal regions on the base;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface on the semiconductor chip disposal region such that the second main surface faces the semiconductor chip disposal region;

(4) forming wiring patterns which are extended from the electrode pads to a region including the upper side of the extension portion;

(5) forming a plurality of electrode posts on each of the part of the wiring patterns on the extension portion;

(6) forming a sealing portion on the wiring patterns and electrode posts such that the top surface of the electrode posts is exposed;

(7) forming external terminals on the top surface of the exposed electrode posts; and (8) severing the plurality of semiconductor chips to form individual semiconductor devices comprising a semiconductor chip.

In this manufacturing method, the step (2) is a step for covering the regions other than the semiconductor chip disposal regions on the base with an insulating material, and a step of forming the extension portion by curing this insulating material is preferably comprised between the steps (3) and (4).

Further, a manufacturing method for a semiconductor device comprises:

(1) setting a plurality of semiconductor chip disposal regions, on which a plurality of semiconductor chips is to be disposed, at a predetermined pitch on a base;

(2) forming an extension portion from an insulating material such that a concave portion is formed on the semiconductor chip disposal region;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface within the concave portion such that the second main surface faces the concave portion;

(4) forming wiring patterns which are extended from the electrode pads to a region including the upper side of the extension portion;

(5) forming a plurality of external terminals over the wiring patterns in a region including the upper side of the extension portion; and (6) severing the plurality of semiconductor chips to form individual semiconductor devices comprising a semiconductor chip.

Further, a manufacturing method for a semiconductor device comprises:

(1) setting a plurality of semiconductor chip disposal regions, on which a plurality of semiconductor chips is to be disposed, at a predetermined pitch on a base;

(2) forming an extension portion from an insulating material such that a concave portion is formed on the semiconductor chip disposal region;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface within the concave portion such that the second main surface faces the concave portion;

(4) forming wiring patterns which are extended from the electrode pads to a region including the upper side of the extension portion;

(5) forming a plurality of electrode posts on each of the part of the wiring patterns on the extension portion;

(6) forming a sealing portion on the wiring patterns and electrode posts such that the top surface of the electrode posts is exposed;

(7) forming external terminals on the top surface of the exposed electrode posts; and (8) severing the plurality of semiconductor chips to form individual semiconductor devices comprising a semiconductor chip.

Here, the step (2) is a step for covering the regions other than the semiconductor chip disposal regions on the base with an insulating material, and a step of forming the extension portion by curing this insulating material is preferably comprised between the steps (3) and (4).

Further, a manufacturing method for a semiconductor device comprises:

(1) setting a plurality of semiconductor chip disposal regions, on which a plurality of semiconductor chips is to be disposed, at a predetermined pitch on a base;

(2) forming an extension portion from an insulating material in the regions other than the semiconductor chip disposal regions on the base;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface on the semiconductor chip disposal region such that the second main surface faces the semiconductor chip disposal region;

(4) forming an insulating film on the surface of the extension portion and the surface protecting film such that the electrode pads are exposed;

(5) forming wiring patterns which are extended from the electrode pads to a region including the upper side of the extension portion;

(6) forming a sealing portion on the insulating film on which the wiring patterns are formed such that a part of each of the wiring patterns positioned on the extension portion is exposed;

(7) forming a plurality of external terminals over the wiring patterns in a region including the upper side of the extension portion and connecting the external terminals to the wiring patterns; and (8) severing the plurality of semiconductor chips to form individual semiconductor devices comprising a semiconductor chip.

Further, a manufacturing method for a semiconductor device comprises:

(1) setting a plurality of semiconductor chip disposal regions, on which a plurality of semiconductor chips is to be disposed, at a predetermined pitch on a base;

(2) forming an extension portion from an insulating material on the regions other than the semiconductor chip disposal regions on the base;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface on the semiconductor chip disposal region such that the second main surface faces the semiconductor chip disposal region;

(4) forming an insulating film on the surface of the extension portion and the surface protecting film such that the electrode pads are exposed;

(5) forming wiring patterns which are extended from the electrode pads to a region including the upper side of the extension portion;

(6) forming a plurality of electrode posts on each of the part of the wiring patterns on the extension portion;

(7) forming a sealing portion on the wiring patterns and electrode posts such that the top surface of the electrode posts is exposed;

(8) forming external terminals on the top surface of the exposed electrode posts; and (9) severing the plurality of semiconductor chips to form individual semiconductor devices comprising a semiconductor chip.

Here, the step (2) is a step for covering the regions other than the semiconductor chip disposal regions on the base with an insulating material, and a step of forming the extension portion by curing this insulating material is preferably comprised between the steps (3) and (4).

Further, a manufacturing method for a semiconductor device comprises:

(1) setting semiconductor chip disposal regions, on which a plurality of semiconductor chips is to be disposed, at a predetermined pitch on a base;

(2) providing an insulating material such that a concave portion is provided on the semiconductor chip disposal regions on the base;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface within the concave portion such that the second main surface faces the semiconductor chip disposal region;

(4) forming an extension portion by curing the insulating material;

(5) forming an insulating film on the surface of the extension portion and the surface protecting film such that the electrode pads are exposed;

(6) forming wiring patterns which are extended from the electrode pads to a region including the upper side of the extension portion;

(7) forming a sealing portion on the insulating film on which the wiring patterns are formed such that a part of each of the wiring patterns positioned on the extension portion is exposed;

(8) forming a plurality of external terminals over the wiring patterns in a region including the upper side of the extension portion and connecting the external terminals to the wiring patterns; and (9) severing the plurality of semiconductor chips to form individual semiconductor devices comprising a semiconductor chip.

Further, a manufacturing method for a semiconductor device comprises:

(1) setting semiconductor chip disposal regions, on which a plurality of semiconductor chips is to be disposed, at a predetermined pitch on a base;

(2) providing an insulating material such that a concave portion is provided on the semiconductor chip disposal regions on the base;

(3) providing a semiconductor chip comprising a first main surface on which a plurality of electrode pads is provided, a surface protecting film which is formed on the first main surface such that the electrode pads are exposed, a second main surface which opposes the first main surface, and a plurality of side surfaces between the surface of the surface protecting film and second main surface within the concave portion such that the second main surface faces the semiconductor chip disposal region;

(4) forming an extension portion by curing the insulating material;

(5) forming an insulating film on the surface of the extension portion and the surface protecting film such that the electrode pads are exposed;

(6) forming wiring patterns which are extended from the electrode pads to a region including the upper side of the extension portion;

(7) forming a plurality of electrode posts on each of the part of the wiring patterns on the extension portion;

(8) forming a sealing portion on the wiring patterns and electrode posts such that the top surface of the electrode posts is exposed;

(9) forming external terminals on the top surface of the exposed electrode posts; and

(10) severing the plurality of semiconductor chips to form individual semiconductor devices comprising a semiconductor chip.

According to this manufacturing method for the semiconductor device of this invention, a semiconductor device can be provided by means of a simple process and with a greater functional sophistication, number of functions, and compactness. In particular, design freedom in the disposal pitch, disposal positions, and so on of the external terminals can be greatly increased.

BRIEF DESCRIPTION OF THE DRAWINGS

The foregoings and other objects, features and advantageous of the present invention will be better understood from the following description taken in connection with the accompanying drawings, in which.

DESCRIPTION OF THE PREFERRED EMBODIMENTS

Figure 1A:
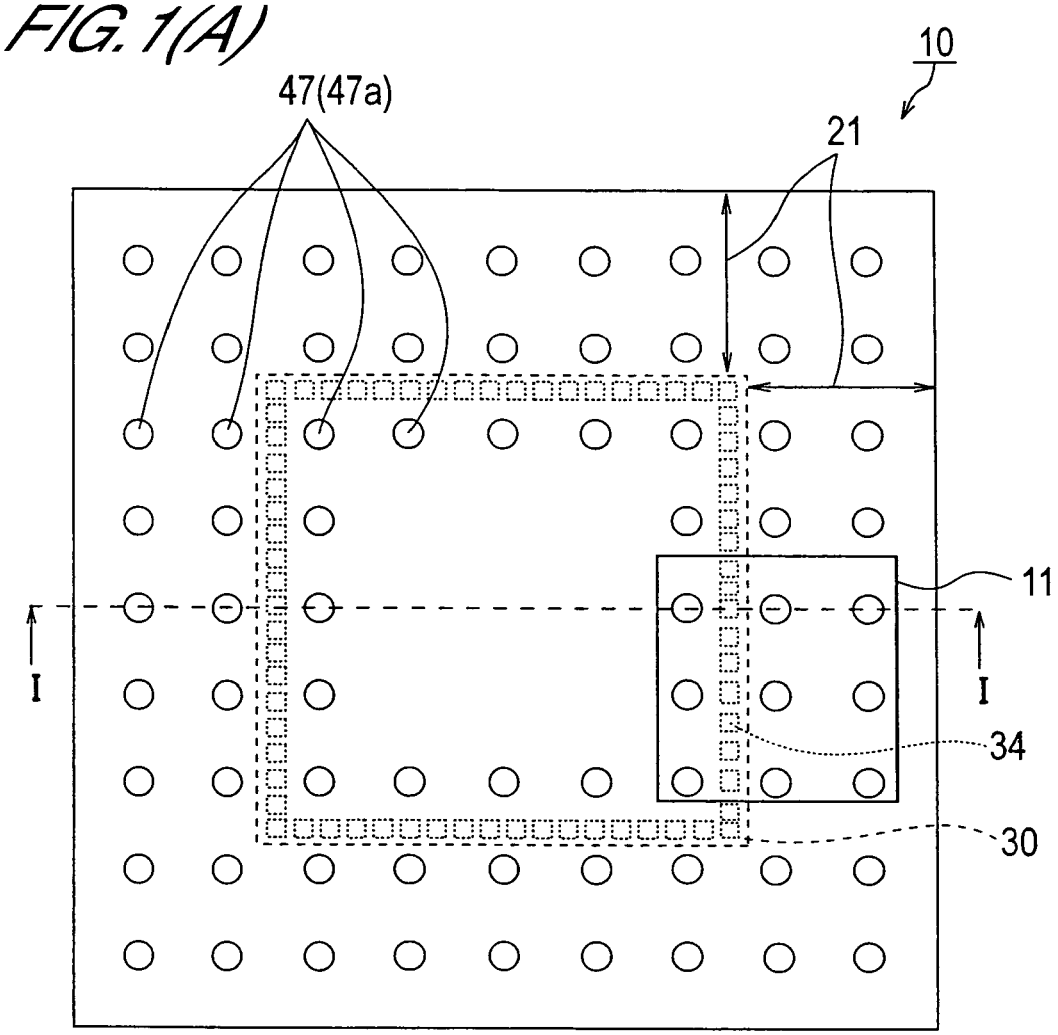
FIG. 1(A) is a plan view seen from above showing in outline the constitution of a semiconductor device of this invention.

Embodiments of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and so on are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

First Embodiment

Figure 1B:
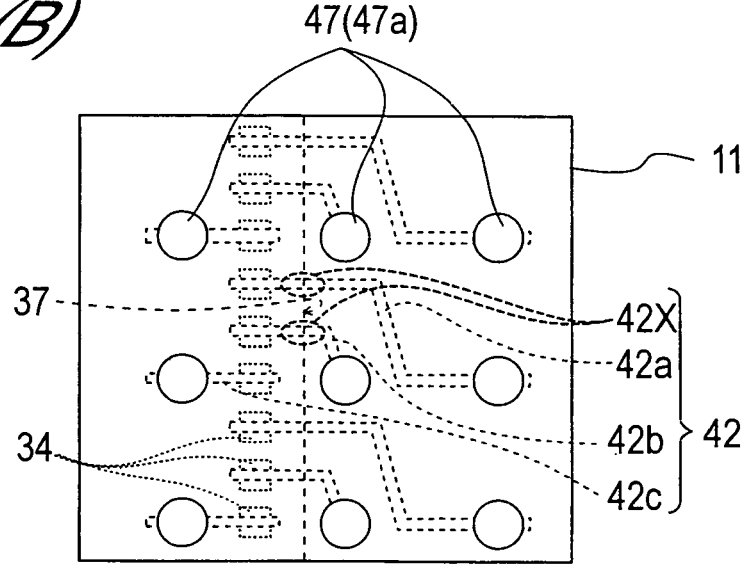
FIG. 1(B) is a plan view showing an expanded outline of the main parts of a region of FIG. 1(A) in order to illustrate the connection relationship between a wiring pattern and electrode pads.
Figure 2:
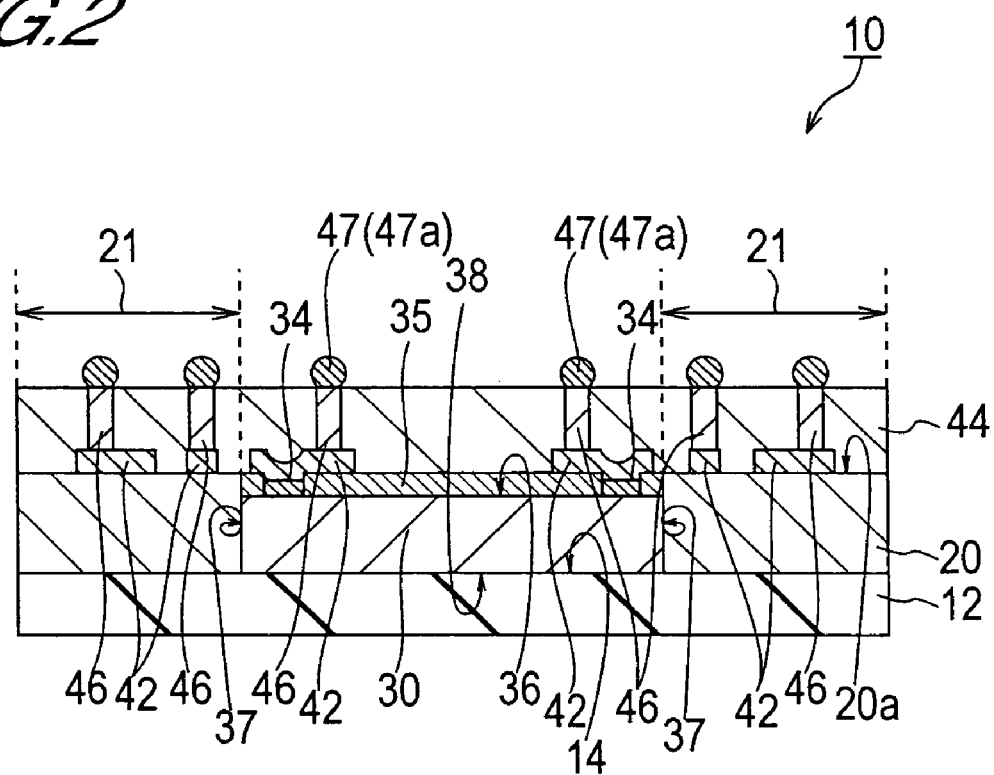
FIG. 2 is a schematic sectional view showing a cross section of the semiconductor device according to the first embodiment severed along a broken line I-I in FIG. 1(A)

A semiconductor device according to a first embodiment of this invention will now be described with reference to FIGS. 1 and 2. FIG. 1(A) is a plan view seen from above showing in outline the constitution of the semiconductor device of the first embodiment, and FIG. 1(B) is a plan view showing an expanded outline of the main parts of a partial region of FIG. 1(A) in order to illustrate the connection relationship between a wiring pattern and electrode posts. FIG. 2 is a schematic sectional view showing a cross section severed along a broken line I-I in FIG. 1(A).

A semiconductor device 10 of the first embodiment of this invention comprises a semiconductor chip 30 on a base 12.

The base 12 may be appropriately selected as desired from a plate-form or sheet-form body made of an organic material such as a glass epoxy or a polyimide, for example, or a ceramic substrate, a metallic substrate, an Si substrate, or similar. A metallic substrate is preferably selected in order to increase the thermal radiation effect of the semiconductor chip.

Note that the form of the semiconductor device 10 and semiconductor chip 30 is described as a rectangular parallelepiped below, but the forms thereof are not limited to a rectangular parallelepiped.

A circuit element (not shown) having a predetermined function is provided on the semiconductor chip 30. The semiconductor chip 30 comprises a first main surface 36 and a second main surface 38 which opposes the first main surface 36. The semiconductor chip 30 also comprises a surface protecting film 35 on the first main surface 36 and one, two, or more side surfaces 37 which exist between the surface of the surface protecting film 35 and the second main surface 38. The surface protecting film 35 is constituted by an insulating material. A plurality of electrode pads 34 connected to the circuit element is formed on the first main surface 36 around the peripheral edge of the first main surface 36 such that at least a part thereof is exposed on the surface protecting film 35.

The semiconductor chip 30 is provided on the base 12 such that the first main surface 36 becomes the upper surface, or in other words such that the second main surface 38 faces a semiconductor chip disposal region 14 on the base 12.

The semiconductor device 10 of this invention also comprises an extension portion 20 in a region other than the semiconductor chip disposal region on the base 12. The extension portion 20 is provided surrounding the side surfaces 37 of the semiconductor chip 30 which is disposed on the semiconductor chip disposal region 14 on the base 12, or in other words the surfaces of the semiconductor chip 30 other than the surface of the surface protecting film 35 and the first and second main surfaces 36 and 38. At this time, the level of the surface of the surface protecting film 35 on the semiconductor chip 30 is set to be substantially equal to the level of a first surface 20a of the extension portion 20.

The extension portion 20 may be formed by appropriately selecting an insulating material such as epoxy resin, for example. A conventionally applied so-called liquid resin or mold resin may be used.

In order to prevent warping of the semiconductor device 10 of this invention during the manufacturing process thereof, the extension portion 20 is preferably formed from an insulating material having a larger molding shrinkage than the molding shrinkage of a subsequently formed sealing portion.

Here, "molding shrinkage" indicates shrinkage of a single material occurring during a molding process. In other words, "molding shrinkage" corresponds to the sum of curing shrinkage at molding temperature and thermal contraction occurring during the return from molding temperature to normal temperature (similarly in the following descriptions).

More specifically, the extension portion 20 is preferably formed using as a material an insulating liquid resin having a coefficient of linear expansion within a lower temperature range than glass transition point of less than $1.5 \times 10^{-5}/°C$. and a modulus of elasticity within a range of 7.8 to 22 GPa. A case in which mold resin is applied to the extension portion 20 will be described hereinafter.

Wiring patterns 42 are formed on the first surface 20a of the extension portion 20 and the surface protecting film 35 so as to be electrically connected to the electrode pads 34. In order to be electrically connected to the electrode pads 34, the wiring patterns 42 comprise patterns which are extended from the electrode pads 34, or in other words the upper side of the surface protecting film 35, to a region including the upper side of the extension portion 20, or in other words an extended region 21.

A sealing portion 44 is provided so as to cover the surface protecting film 35 and extension portion 20 on which the wiring patterns 42 are formed. Electrode posts 46 are provided so as to pass from each of the wiring patterns 42 through the sealing portion 44 to reach the surface of the sealing portion 44. A part of the electrode posts 46 is provided on the upper side of (directly above) the semiconductor chip 30, and the remaining electrode posts 46 are provided on the upper side of (directly above) the extension portion 20. These electrode posts 46 are normally arranged at a constant pitch. Apart, or in other words the top surface (surface), of each electrode post 46 is exposed on the surface of the sealing portion 44. The electrode posts 46 are also referred to as post electrodes, and external terminals 47 are provided on the exposed top surface thereof. Solder balls 47a are usually provided as the external terminals 47. These external terminals 47 are arranged at a wider pitch than the arrangement pitch of the electrode pads 34.

Here, using FIG. 1(B), the connection relationships between the electrode pads 34 and wiring patterns 42 will be described. A partial region (the region surrounded by the solid line) 11 of FIG. 1(A) has been expanded and illustrated in order to facilitate understanding of these connection relationships. The wiring patterns 42 are constituted such that each of the electrode posts (shown as 46 in FIG. 2) connected to the lower portion of the external terminals 47 is regularly and electrically connected to a corresponding electrode pad 34. A long wire 42a, a medium wire 42b, and a short wire 42c, for example, are provided as the wires which constitute each wiring pattern 42. These wires 42a, 42b, and 42c are respectively connected to the corresponding electrode pads 34 in a one-on-one connection relationship of one wire to one electrode pad. The wire width, wire spacing, optimum angles, and so on of the wiring patterns 42 are determined in accordance with applicable wiring process rules such that connections to the electrode pads 34 can be made at the shortest possible distances.

The wiring patterns 42 are provided in a region on the upper side of (directly above) the semiconductor chip 30 and on the upper side of (directly above) the extension portion 20, or in other words straddling the boundary of the extended region 21.

Accordingly, portions 42X of the wiring patterns 42 on or in the vicinity of this boundary is preferably comprised of thicker and/or wider wire over a certain length.

In other words, portions of the wiring patterns on a boundary and vicinity thereof between semiconductor chip and the extension portion are formed wider or more thickly than other portions of said wiring patterns.

By forming the portions 42X of the wiring patterns 42 at which stress concentration is considered more likely, due to such phenomena as thermal stress and particularly an edge effect, to be thicker in this manner, operational reliability in the semiconductor device 10 is improved.

The region on the upper side of (directly above) the extension portion 20 is referred to as the extended region 21 due to the fact that an external terminal forming region extends beyond the surface region of the semiconductor element. In this constitutional example, the electrode posts 46 are also formed on the extended region 21. The sealing portion 44 is formed so as to cover the wiring patterns 42 and electrode posts 46. The sealing portion 44 is formed such that a part of the electrode posts 46 is exposed.

The external terminals 47 are formed via the electrode posts 46. A constitution is also possible in which the external terminals are directly connected to the wiring patterns 42 without passing through the electrode posts by exposing a part of the wiring patterns 42 through the sealing portion 44.

In this constitutional example, the external terminals 47 are formed from solder balls 47a, for example. These solder balls 47a are provided on the top surface of the exposed electrode posts 46 and connected to the wiring patterns 42 via the electrode posts 46. The arrangement and pitch of adjacent electrode posts 46 may be set as desired in consideration of mounting onto a printed board or the like, for example.

As described above, the electrode posts 46 are provided not only within a surface area range corresponding to the upper side of the semiconductor chip 30, but also on the upper side of the extension portion 20, or in other words on the extended region 21. As a result, design freedom in the disposal positions and disposal pitch of the electrode posts 46 is increased. In other words, restrictions on the disposal pitch of the external terminals 47 are eased such that mounting is facilitated, and thus the external terminals 47 can be formed at wider intervals in accordance with the constitutional requirements on the mounting substrate side, for example. More specifically, a desired number of external electrodes can be formed at an appropriate disposal pitch by appropriately adjusting the surface area of the extension portion 20.

According to the constitution of the semiconductor device 10 of this invention, the external terminals 47 are provided outside of the region directly above the semiconductor chip 30, or in other words on the extended region 21, and thus the semiconductor device 10 can be constituted in a so-called fan-out constitution or a fan-in/fan-out constitution in which the external terminals 47 are also formed in a region on the surface protecting film 35. As a result, design freedom in the disposal pitch, disposal positions, and so on of the external terminals 47 can be increased.

The semiconductor device 10 of this invention is constituted using a so-called WCSP manufacturing process such that the semiconductor chip 30 and external terminals 47 are directly connected without the use of an interposer such as a substrate, and thus in addition to the aforementioned effect, the operational speed, functional sophistication, number of functions, and compactness of the semiconductor device 10 can be increased in comparison with a device in which a wire bonding connection, for example, is used. The semiconductor device 10 can also be obtained with an identical electrical characteristic to and at a lower cost than a device in which a flip chip connection, for example, is used.

Next, a manufacturing method for the semiconductor device of the first embodiment will be described with reference to FIGS. 3(A) to 9(B).

As a rule, each Fig. (A) is a partial schematic plan view for illustrating the constitution of the semiconductor device of this invention, and each Fig. (B) is a schematic sectional view showing a cross section severed along a broken line I-I of the corresponding Fig. (A). Note that FIGS. 5(B) and 6 are exceptions to this rule, being an enlarged view of the part of FIG. 5(A) which is surrounded by a solid line 11 and a sectional view severed along the I-I line of FIG. 5(A) respectively.

In the description of the manufacturing method for the semiconductor device of this invention, an example is illustrated in each of the drawings in which a plurality of semiconductor devices 10 is manufactured simultaneously by disposing a plurality of semiconductor chips in a 2 (vertical)×X (horizontal, X being a positive number of no less than 2) lattice formation on a base. However, this invention is not limited thereto, and semiconductor devices may be manufactured simultaneously by arranging a larger number of semiconductor chips in a larger lattice formation.

Semiconductor chip disposal regions 14 on which the plurality of semiconductor chips 30 will be placed in a subsequent step are set in advance on the base 12. Note that the profile of the semiconductor chip disposal region 14 substantially matches the profile of the second main surface 38 of the semiconductor chip 30. The intervals between adjacent semiconductor chip disposal regions 14 are set to be equal. This interval is determined in consideration of the margin surface area required in a subsequent singularization step, the surface area of the extension portion 20 which is formed in accordance with the desired number of external terminals, and so on.

Figure 3A:
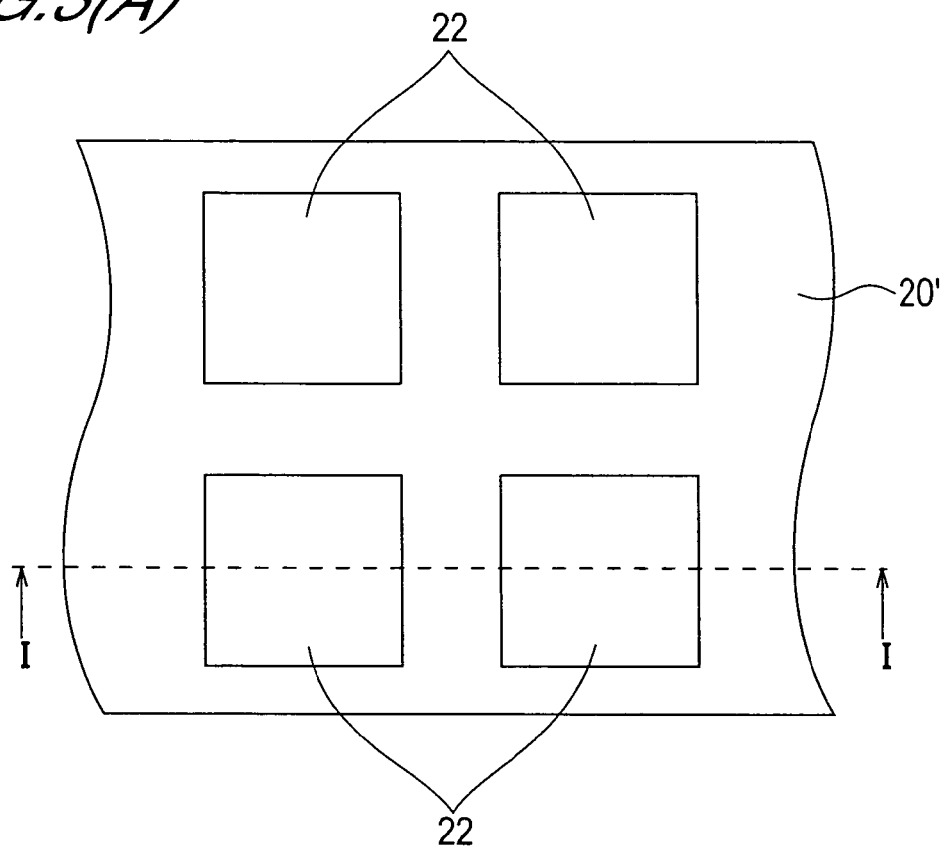
FIGS. 3(A) and 3(B) are a schematic plan view seen from above and a sectional view (1) for illustrating a manufacturing method for the semiconductor device according to the first embodiment of this invention.
Figure 3B:
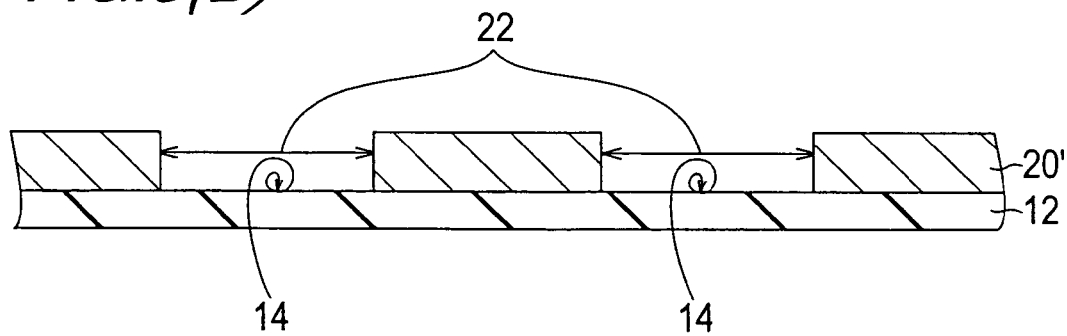

First, as shown in FIGS. 3(A) and 3(B), an insulating material 20' is provided in the regions other than the semiconductor chip disposal regions 14, which are set on the base 12, such that the semiconductor chip disposal regions 14 are exposed. The insulating material 20' may be formed by appropriately selecting an insulating material such as epoxy resin, for example. A conventionally applied so-called liquid resin or mold resin may be applied.

The following methods, for example, may be applied to the formation of the extension portion 20.

Insulating epoxy resin or the like having a certain degree of viscosity, for example, serves as the insulating material 20'.

(1) The insulating material 20' is supplied by a dispensing method such that the semiconductor disposal regions 14 are exposed. The insulating material 20' is then cured under the optimum conditions and processing for the selected insulating material 20'.

(2) The insulating material 20' is supplied by a precision printing method such that the semiconductor chip disposal regions 14 are exposed. The insulating material 20' is then cured under the optimum conditions and processing for the selected insulating material 20'.

(3) The insulating material 20' is supplied by a photolithography method onto the entire surface of the base 12. Patterning is then performed by means of a well-known masking, exposing, and developing process under the optimum conditions and processing for the selected insulating material 20' to form the extension portion 20.

Here, the insulating material 20' is a material such as paste-form epoxy resin having a certain degree of viscosity at room temperature, for example, which can be cured by suitable processing such as heating or ultraviolet radiation.

In order to prevent warping of the semiconductor device 10 during the manufacturing process, the extension portion 20 is preferably formed from an insulating material having a larger molding shrinkage than the molding shrinkage of a subsequently formed sealing portion. More specifically, the extension portion 20 is preferably formed from a liquid resin having a coefficient of linear expansion within a lower temperature range than glass transition temperature of less than $1.5 \times 10^{-5}/°$ C. and a modulus of elasticity within a range of 7.8 to 22 GPa.

Dimensional accuracy in the direction of thickness may be improved particularly when mold resin is applied to the extension portion 20, as a result of which the extension portion 20 may be formed with a higher degree of precision.

Figure 4A:
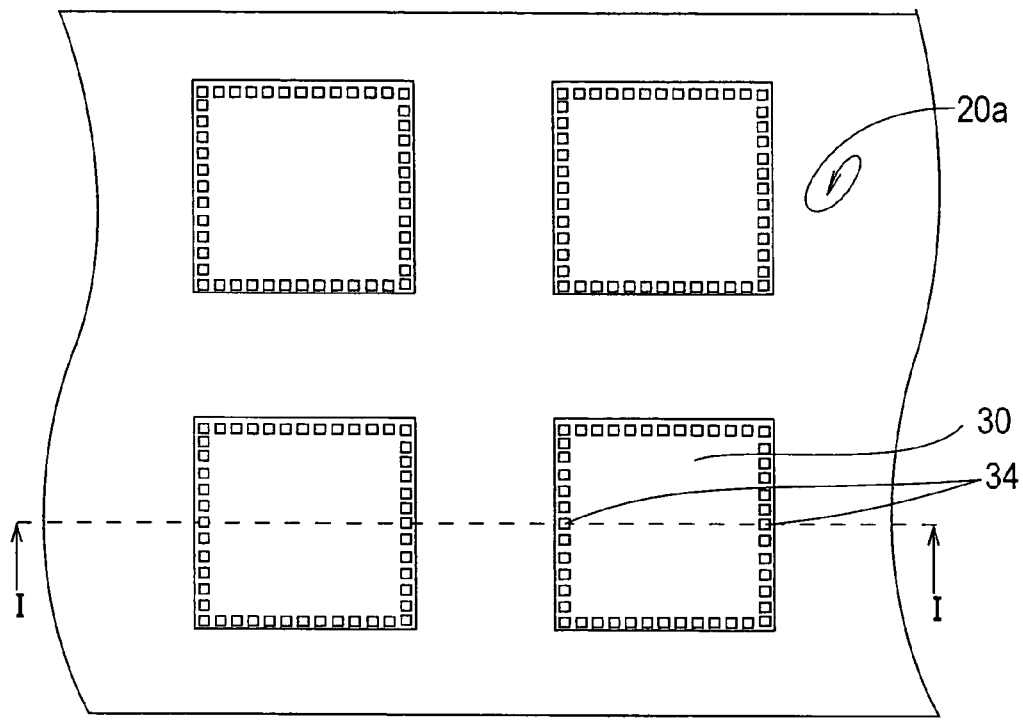
FIGS. 4(A) and 4(B) are a schematic plan view seen from above and a sectional view (2) for illustrating the manufacturing method for the semiconductor device according to the first embodiment of this invention.
Figure 4B:
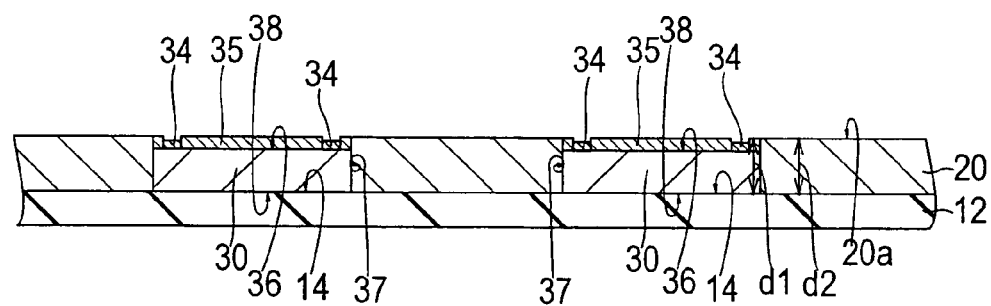

Next, as shown in FIG. 4, the semiconductor chip 30 is provided on the exposed semiconductor chip disposal region 14.

A circuit element (not shown) having a predetermined function is provided on the semiconductor chip 30. The semiconductor chip 30 comprises the first main surface 36 and the second main surface 38 which opposes the first main surface 36. The semiconductor chip 30 also comprises the surface protecting film 35 on the first main surface 36 and one, two, or more side surfaces 37 which exist between the surface of the surface protecting film 35 and the second main surface 38. The surface protecting film 35 is constituted by an insulating material. The plurality of electrode pads 34 connected to the circuit element is formed on the first main surface 36 around the peripheral edge of the first main surface 36 such that at least a part thereof is exposed from the surface protecting film 35.

The semiconductor chip 30 is disposed such that the second main surface 38 faces the semiconductor chip disposal region 14 on the base 12, and the extension portion 20 is disposed so as to surround the surfaces of the semiconductor chip 30 other than the surface of the surface protecting film 35 and the second main surface 38, or in other words the side surfaces 37. At this time, the outer dimensions of the forming region, including thickness, of the extension portion 20 and/or the semiconductor chip are adjusted such that a level (height) d1 of the surface of the surface protecting film 35 is substantially equal to a level d2 of the first surface 20a of the extension portion 20 following curing processing, and such that gaps are not produced between the semiconductor chip 30 and extension portion 20.

A type of adhesion means is preferably provided on the semiconductor chip disposal region 14. The semiconductor chip 30 is preferably adhered to and held on the semiconductor chip disposal region 14 using these adhesion means.

In the example described above, the semiconductor chip 30 is provided on the semiconductor chip disposal region 14 after the extension portion 20 is formed by providing and curing the insulating material 20'. However, the extension portion 20 may be formed by providing the insulating material 20', for example an insulating epoxy resin having a certain degree of viscosity, on the regions other than the semiconductor chip disposal region 14 using method (1) or (2), providing the semiconductor chip 30 on the semiconductor chip disposal region 14, and then curing the insulating material 20'. At this time, the thickness of the insulating material 20' should be adjusted such that the level of the surface of the surface protecting film 35 is substantially equal to the level of the first surface 20a of the extension portion 20 following curing.

Next, as shown in FIGS. 5 and 6, a plurality of wiring patterns 42 is formed on the surface protecting film 35 and the first surface 20a of the extension portion 20. Formation of the wiring patterns 42 is performed in consideration of the disposal of the subsequently formed external terminals following the setting of the wiring patterns 42 so as to be electrically connected to the corresponding electrode pads 34. The plurality of wiring patterns 42 comprises patterns which are extended from the electrode pads 34 to the extension portion 20, or in other words to the extended region 21.

More specifically, the wire width, wire spacing, optimum angles, and so on are determined in accordance with applicable wiring process rules such that connections can be made at the shortest possible distances. As shown in the drawings, for example, a plurality of wiring pattern groups, each comprising the long wire 42a, medium wire 42b, and short wire 42c, is formed in respect of the plurality of electrode pads 34 formed around the peripheral edge of the semiconductor chip 30 at the shortest possible distances, and one end portion of each wire is connected to the corresponding electrode pad 34. An electrode post mounting pad is formed on the other end portion so that an external terminal 47 (solder ball 47a) can be connected thereto via an electrode post. The long wire 42a and medium wire 42b in particular are provided so as to lead from the electrode pads 34 provided on the surface protecting film 35 to the upper side of (directly above) the extension portion 20.

Figure 5A:
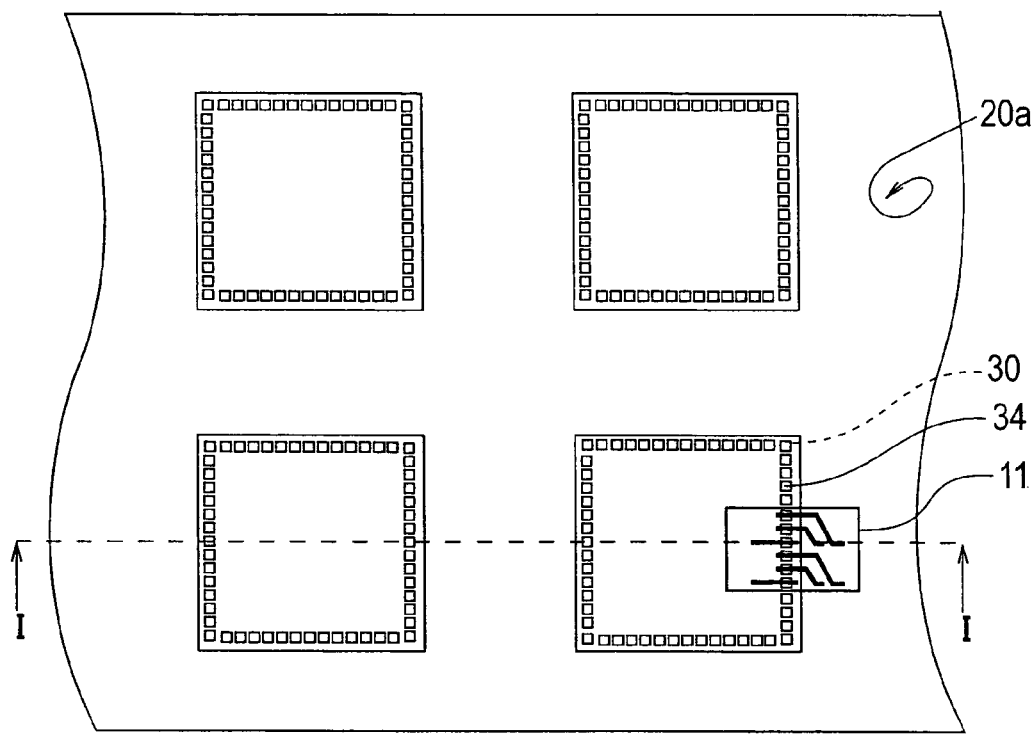
FIGS. 5(A) and 5(B) are a schematic plan view seen from above and an enlarged plan view of the main parts thereof (3) for illustrating the manufacturing method for the semiconductor device according to the first embodiment of this invention.
Figure 5B:
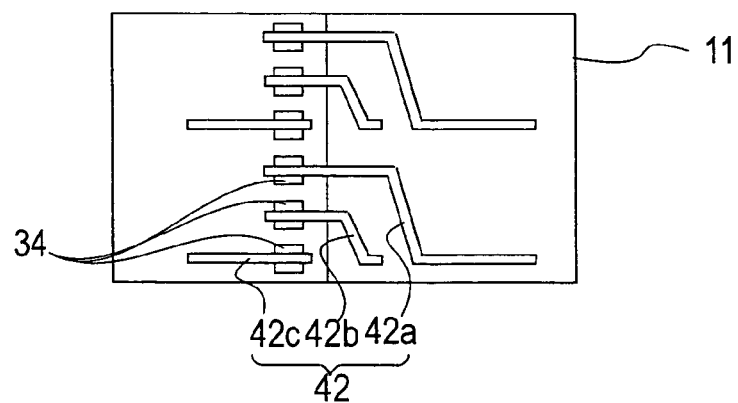
Figure 6:
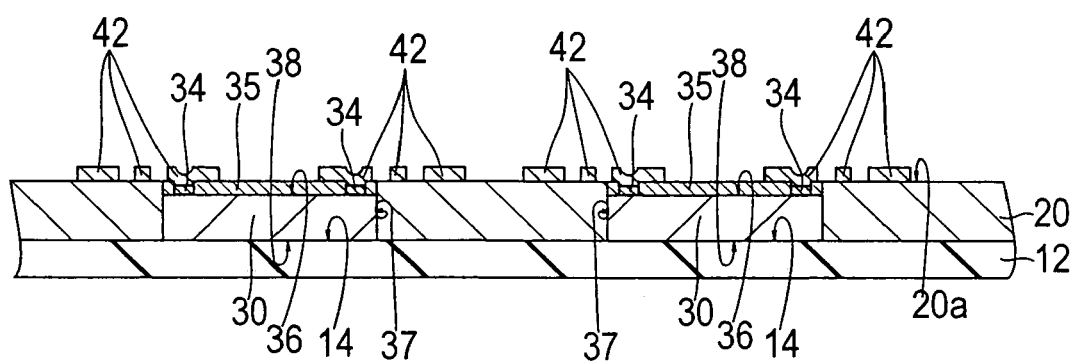
FIG. 6 is a schematic sectional view (3-2) for illustrating the manufacturing method for the semiconductor device according to the first embodiment of this invention.

Note that to facilitate description, the disposed electrode pads 34 in FIGS. 4(A) and 5(A) are illustrated schematically in a smaller number than the actual number (similarly in the following drawings).

The wiring patterns 42 may be formed in a desired region including the region on the upper side of (directly above) the first surface 20a of the extension portion 20 by means of a wiring pattern formation process in a well-known WCSP manufacturing process such as sputtering or photolithography using an appropriately selected material such as copper, aluminum, or a metal alloy, for example.

In the wiring pattern 42 forming step, a small gap may form between the semiconductor chip 30 and extension portion 20 as described above. If stress becomes concentrated in the wiring patterns 42 due to such a gap or the like, a region of the wiring patterns 42 substantially including the part of the wiring patterns 42 at which stress is concentrated may be formed slightly thicker and/or wider.

Figure 7A:
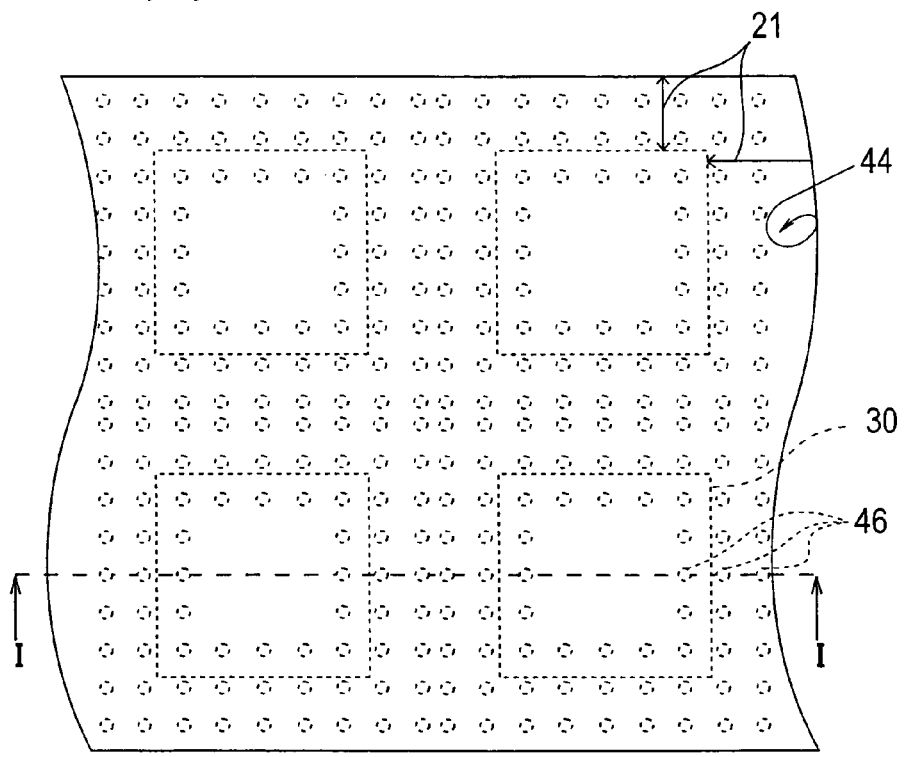
FIGS. 7(A) and 7(B) are a schematic plan view seen from above and a sectional view (4) for illustrating the manufacturing method for the semiconductor device according to the first embodiment of this invention.
Figure 7B:
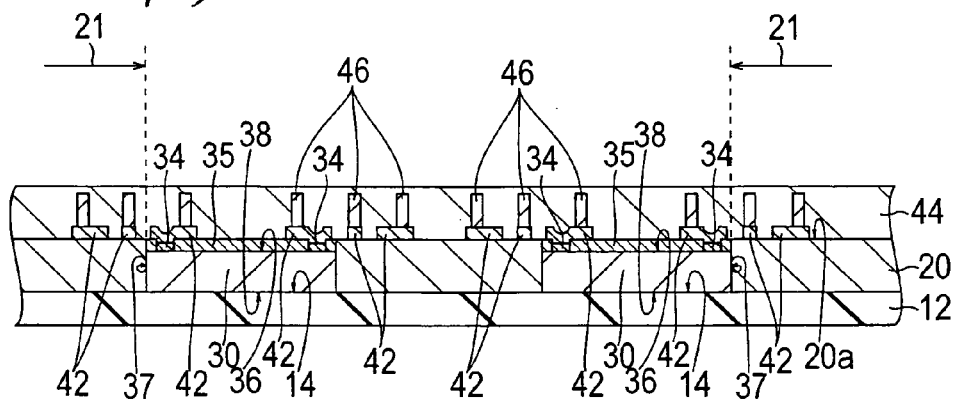

Next, as shown in FIGS. 7(A) and 7(B), electrode posts are formed on the surface of each wiring pattern 42 so as to be electrically connected thereto. The electrode posts 46 are provided on the extended region 21 on the upper side of (directly above) the extension portion 20 and in the region on the upper side of (directly above) the semiconductor chip 30. The electrode posts 46 are formed in a lattice formation and arranged at a predetermined pitch. As described above, this pitch may be set in consideration of mounting, or in other words as either a constant or irregular pitch.

After an appropriate material has been selected, the electrode posts 46 may be formed by means of an electrode post 46 forming process in a well-known WCSP manufacturing process such as plating or photolithography.

The sealing portion 44 is then formed so as to cover the wiring patterns 42 and electrode posts 46 formed on the upper side of (directly above) the first surface 20a of the extension portion 20 and the upper side of (directly above) the semiconductor chip 30.

This sealing step may be implemented by means of a well-known method using a well-known sealing material such as an epoxy mold resin.

Here, a general use mold resin having a linear expansion coefficient of 0.6 to $1.3 \times 10^{-5}$/° C., a glass transition temperature (Tg) within a range of 125 to 220° C., and a modulus of elasticity within a range of 9.8 to 24 GPa (1000 to 2450 kg/mm$^2$) may be used.

In order to prevent warping of the semiconductor device 10 during the manufacturing process particularly when the extension portion 20 is formed from a so-called mold resin similarly to the sealing portion 44, the molding shrinkage of the extension portion 20 is determined to be larger than that of the sealing portion 44. The following combinations can be cited as examples of the properties of the mold resin used for forming the extension portion 20 and sealing portion 44.

(1) Extension portion/sealing portion: the properties of the extension portion mold resin are a linear expansion coefficient in a lower temperature range than glass transition temperature within a range of 1.1 to $1.5 \times 10^{-5}$/° C. and a glass transition temperature (Tg) which is larger than 170° C.; the properties of the sealing portion mold resin are a linear expansion coefficient in a lower temperature range than glass transition temperature of less than $1.0 \times 10^{-5}$/° C., a glass transition temperature (Tg) within a range of 125 to 220° C., and a modulus of elasticity within a range of 14.7 to 24 GPa (1500 to 2450 kg/mm$^2$).

(2) Extension portion/sealing portion: the properties of the extension portion mold resin are a linear expansion coefficient in a lower temperature range than glass transition temperature within a range of 1.1 to $1.7 \times 10^{-5}/°$ C., a glass transition temperature (Tg) which is lower than 170° C., and a modulus of elasticity within a range of 9.8 to 19.6 GPa (1000 to 2000 kg/mm$^2$); the properties of the sealing portion mold resin are a linear expansion coefficient in a lower temperature range than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

(3) Extension portion/sealing portion: the properties of the extension portion mold resin are a linear expansion coefficient in a lower temperature range than glass transition temperature within a range of 1.1 to $1.7 \times 10^{-5}/°$ C., a modulus of elasticity of 13.7 GPa (1400 kg/mm$^2$), and a glass transition temperature (Tg) within a range of 125 to 170° C.; the properties of the sealing portion mold resin are a linear expansion coefficient in a lower temperature range than glass transition temperature of less than $1.0 \times 10^{-5}/°$ C., a glass transition temperature (Tg) within a range of 125 to 220° C., and a modulus of elasticity within a range of 14.7 to 24 GPa (1500 to 2450 kg/mm$^2$).

Figure 8A:
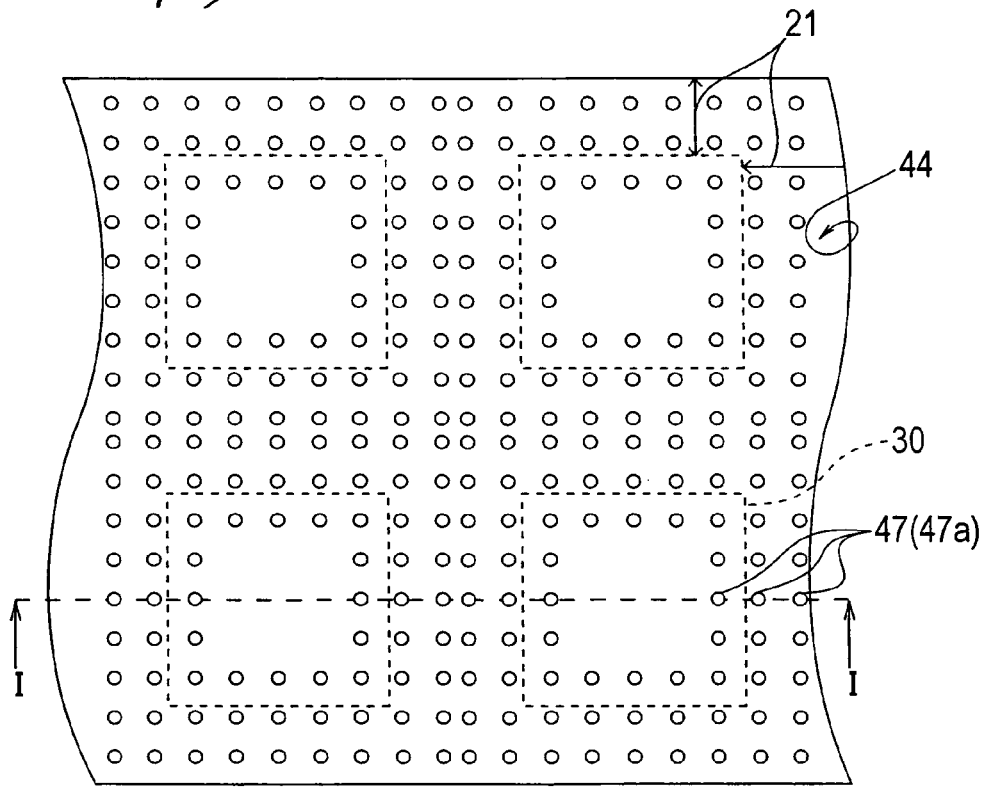
FIGS. 8(A) and 8(B) are a schematic plan view seen from above and a sectional view (5) for illustrating the manufacturing method for the semiconductor device according to the first embodiment of this invention.
Figure 8B:
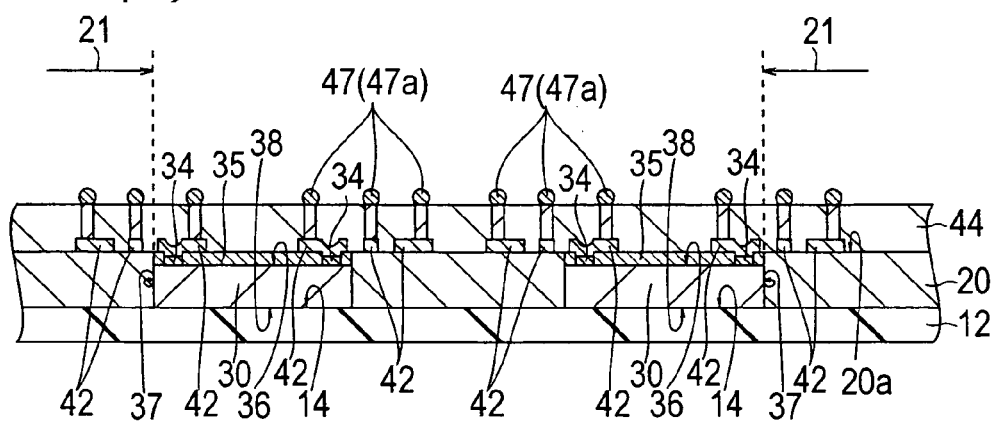

Next, as shown in FIGS. 8(A) and 8(B), the surface side of the sealing portion 44 is trimmed such that a part of the top surface (also referred to as the upper face) of the electrode posts 46 is exposed.

This step is performed using a well-known grinding or polishing process.

A method such as film formation may also be applied to the formation of the sealing portion 44. In this case, substantially no load is placed on the electrode posts 46. Also in this case, the sealing portion 44 can be formed such that the top surface of the electrode posts 46 is directly exposed on the surface of the sealing portion 44 without the need for a grinding process on the sealing portion 44 as described above.

At this time, a type of processing may be performed using a selected material on the upper surface of the exposed electrode posts 46. If the material is copper, for example, a thin Ni (nickel) film or the like may be formed as a barrier metal layer.

Next, solder balls 47a, for example, serving as the external terminals 47 are formed via the electrode posts 46 exposed on the surface of the sealing portion 44 on the upper surface of the electrode posts 46.

Figure 9A:
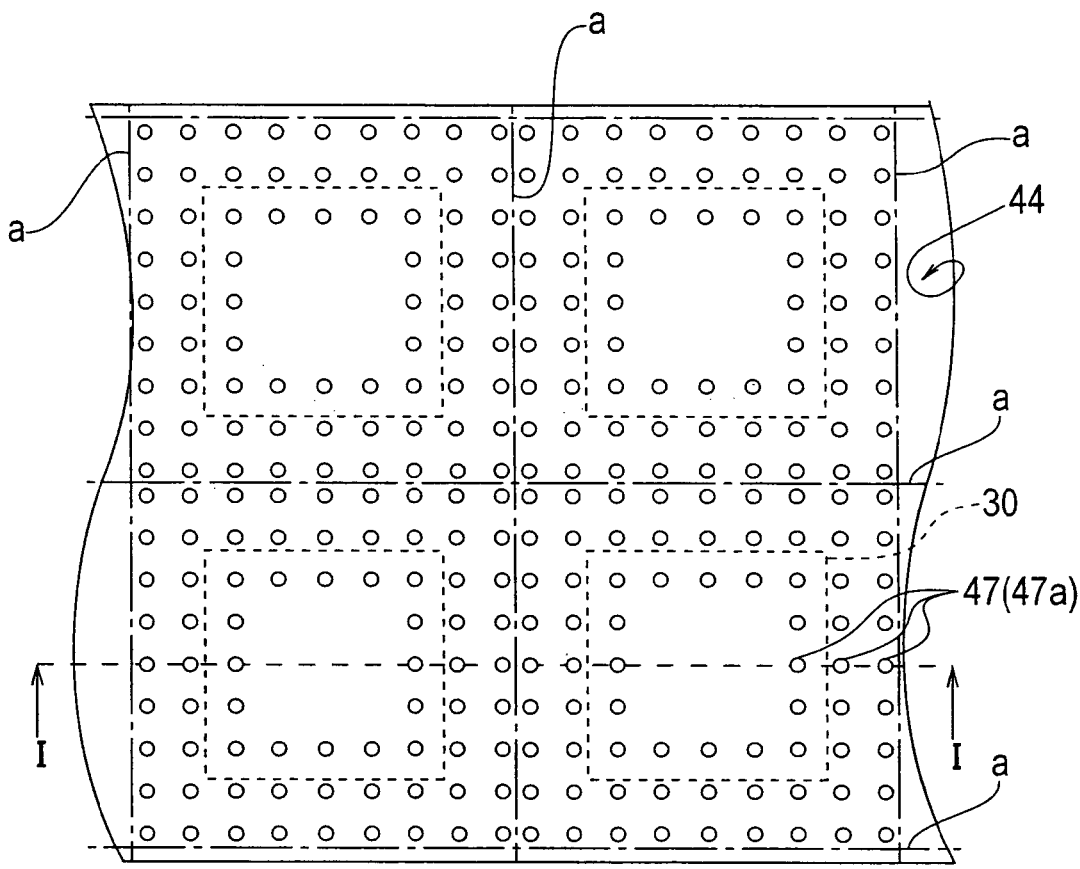
FIGS. 9(A) and 9(B) are a schematic plan view seen from above and a sectional view (6) for illustrating the manufacturing method for the semiconductor device according to the first embodiment of this invention.
Figure 9B:
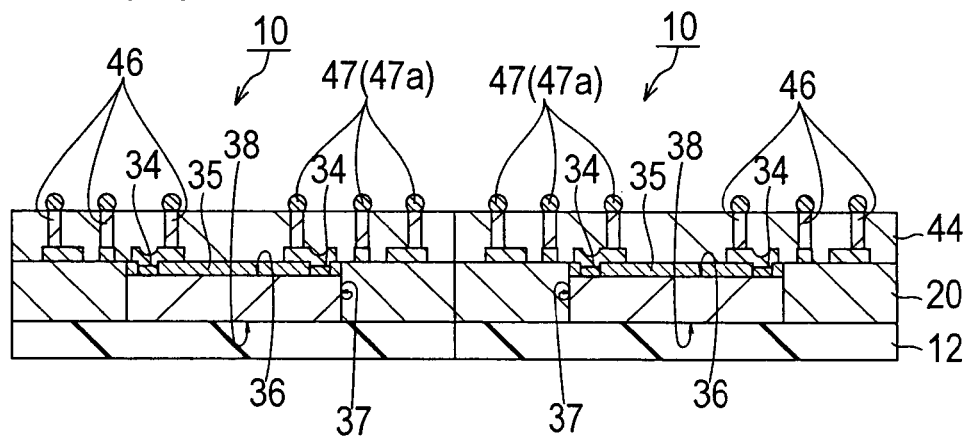

Next, as shown in FIGS. 9(A) and 9(B), the plurality of semiconductor chips is severed along a cutting line shown by a dot/dash line a to provide individual semiconductor devices comprising a semiconductor chip.

This singularization process is preferably performed by cutting using a blade which rotates at high speed.

Since a so-called WCSP manufacturing process can be applied to the manufacturing method of the first embodiment, the semiconductor device 10 can be manufactured by means of a simple process without the need for any special processes for manufacturing the semiconductor device 10.

Second Embodiment

Figure 10:
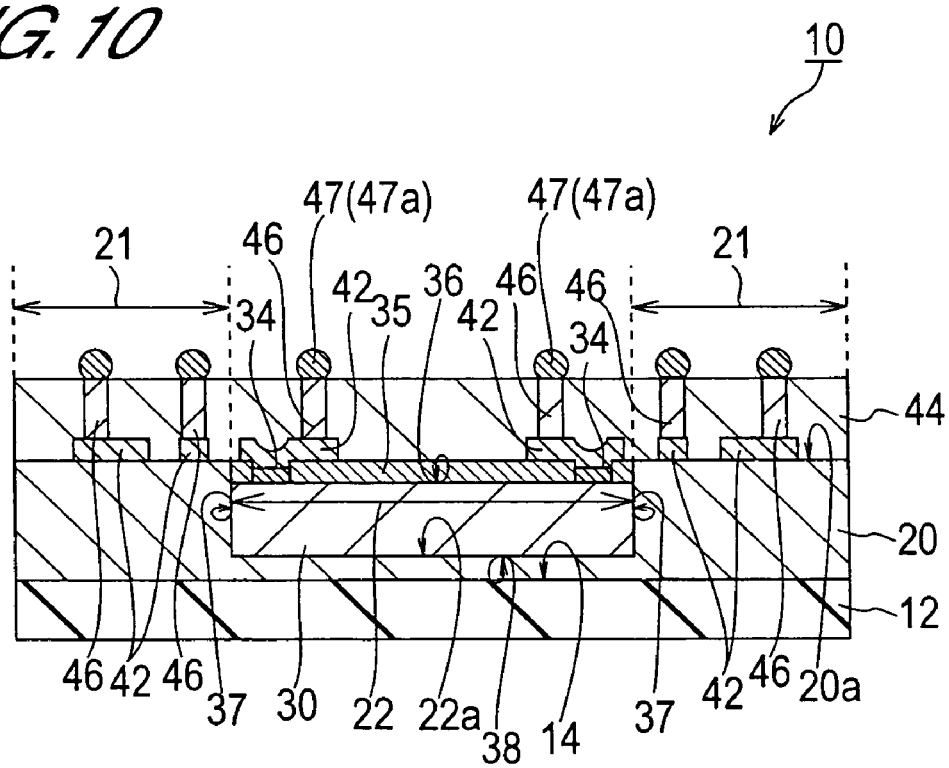
FIG. 10 is a schematic sectional view for illustrating the constitution of a semiconductor device according to a second embodiment of this invention.

A semiconductor device according to a second embodiment of this invention and a manufacturing method therefor will now be described with reference to FIGS. 10 through 12. Note that in the manufacturing process to be described below, applied materials, process implementation conditions, and so on are substantially identical to those of the first embodiment, and hence detailed description thereof has been omitted. Note also that in each drawing, the plan view is similar to that described in the first embodiment, and hence detailed description thereof has also been omitted.

A semiconductor device according to the second embodiment of this invention will now be described with reference to FIG. 10. FIG. 10 is a schematic sectional view of the semiconductor device of the second embodiment.

The semiconductor device 10 according to the second embodiment of this invention comprises a base 12. A semiconductor chip disposal region 14 is set on the base 12.

An insulating extension portion 20 is formed on the base 12. The extension portion 20 comprises a concave portion 22 having a bottom surface portion 22a which matches the profile of the semiconductor chip disposal region 14.

A semiconductor chip 30 is provided within the concave portion 22. The semiconductor chip 30 comprises a circuit element (not shown) having a predetermined function. The semiconductor chip 30 comprises a first main surface 36 and a second main surface 38 which opposes the first main surface 36. The semiconductor chip 30 also comprises a surface protecting film 35 on the first main surface 36 and one, two, or more side surfaces 37 which exist between the surface of the surface protecting film 35 and the second main surface 38. The surface protecting film 35 is constituted by an insulating material. A plurality of electrode pads 34 connected to the circuit element is formed on the first main surface 36 around the peripheral edge of the first main surface 36 such that at least a part thereof is exposed on the surface protecting film 35.

The semiconductor chip 30 is provided such that the first main surface 36 becomes the upper surface, or in other words such that the second main surface 38 faces the bottom surface portion 22a of the concave portion 22 in the extension portion 20.

Hence the extension portion 20 is provided so as to surround the surfaces of the semiconductor chip 30 other than the surface protecting film 35, or in other words the side surfaces 37 and second main surface 38. The extension portion 20 is formed so that the level of the surface of the surface protecting film 35 is substantially equal to the level of a first surface 20a of the extension portion 20 following curing processing.

Requirements for the formation of the extension portion 20, such as the properties of the material used therefor, are identical to those described in the first embodiment, and hence detailed description thereof has been omitted.

As described with reference to FIG. 5, wiring patterns 42 comprising a plurality of wiring patterns are formed on the first surface 20a of the extension portion 20 and the surface protecting film 35 so as to be electrically connected to the exposed electrode pads 34.

The wiring patterns 42 may be formed in desired patterns in consideration of the output signals from the semiconductor chip 30, the disposal positions of the external terminals required by the semiconductor device 10, and so on.

The wiring patterns 42 are provided so as to straddle the boundary between a region on the upper side of (directly above) the semiconductor chip 30 and a region on the upper side of (directly above) the extension portion 20. That is, at least a part of the plurality of wiring patterns 42 is individually and electrically connected to the corresponding electrode pads 34 exposed on the surface protecting film 35, and extended therefrom to the upper side of the extension portion 20, or in other words an extended region 21.

A sealing portion 44 is formed on the first surface 20a of the extension portion 20 and the surface protecting film 35, on which the wiring patterns 42 are formed, such that a part of the wiring patterns 42 is exposed.

External terminals 47 are connected on the exposed wiring patterns 42 in a region including the extension portion 20.

In this constitutional example, the external terminals 47 are also formed in the extended region 21 via electrode posts 46, for example.

In this constitutional example, the external terminals 47 are formed from solder balls 47a, for example. These solder balls 47a are provided in contact with the top surface of the electrode posts 46 and connected to the wiring patterns 42 via the electrode posts 46. The arrangement and pitch of adjacent electrode posts 46 may be set as desired in consideration of mounting onto a printed board or the like, for example.

As described above, the electrode posts 46 are provided not only within a surface area range corresponding to the upper side of the semiconductor chip 30, but also on the upper side of the extension portion 20. As a result, design freedom in the disposal positions and disposal pitch of the electrode posts 46, and hence the external terminals 47, is increased. In other words, restrictions on the disposal pitch of the electrode posts 46, and hence the external terminals 47, are eased such that mounting is facilitated, and thus the electrode posts 46 can be formed at wider intervals in accordance with the constitutional requirements on the mounting substrate side, for example. More specifically, a desired number of external electrodes can be formed at an appropriate disposal pitch by appropriately adjusting the surface area of the extension portion 20.

In addition to the effects obtained by the constitution of the semiconductor device of the first embodiment, the semiconductor device 10 according to the second embodiment of this invention is constituted such that the second main surface 38 of the semiconductor chip 30 is also covered by the extension portion 20, and thus the semiconductor chip 30 can be more effectively protected from the outside environment.

Next, a manufacturing method for the semiconductor device of the second embodiment will be described with reference to FIGS. 11(A) through 12(C).

Each drawing is a schematic sectional view for illustrating the manufacturing method for the semiconductor device of the second embodiment.

Semiconductor chip disposal regions 14 are set in advance on the base 12 in alignment with the outer dimensions of the semiconductor chips 30 to be applied. The intervals between adjacent semiconductor chip disposal regions 14 are set to be equal. This interval is determined in consideration of the margin surface area required in a subsequent singularization step, the surface area of the extension portion which is formed in accordance with the desired number of external terminals, and so on.

Figure 11A:
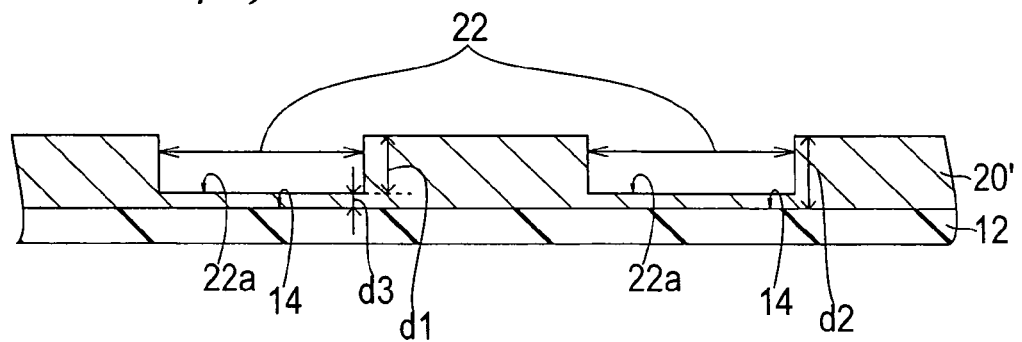
FIGS. 11(A), 11(B), and 11(C) are schematic sectional views (1) for illustrating a manufacturing method for the semiconductor device according to the second embodiment of this invention.

First, as shown in FIG. 11(A), an insulating material 20' for forming the extension portion 20 is provided on the base 12. Here, the insulating material 20' is a material such as a paste-form resin having a certain degree of viscosity at room temperature, for example, and a material which can be cured by suitable processing such as heating or ultraviolet radiation, for example. An insulating material such as epoxy resin may be appropriately selected, for example. A conventionally applied so-called liquid resin or mold resin may be applied as the epoxy resin.

The extension portion 20 may be formed using (1) the dispensing method, (2) the precision printing method, or (3) the photolithography method described in the first embodiment by means of a similar process thereto.

The insulating material 20' is provided on the base 12 so as to comprise the concave portion 22 in which the semiconductor chip 30 is provided. The concave portion 22 is formed with the bottom surface portion 22a which matches the profile of the semiconductor chip disposal region 14. A thickness d3 of the concave portion 22 on the bottom surface portion 22a side may be set appropriately in consideration of the thermal radiation property and so on of the semiconductor chip to be provided subsequently, for example.

First, as the insulating material 20', insulating epoxy resin having a certain degree of viscosity, for example, is provided on the entire surface of the base 12 at an equal thickness to the thickness d3 of the concave portion 22 on the bottom surface portion 22a side using a method such as the aforementioned dispensing method or precision printing method.

Then, following curing processing according to one of these methods, for example, the insulating material 20' is provided in the regions other than the region corresponding to the semiconductor chip disposal region 14 at an equal thickness to the thickness d1 of the subsequently provided semiconductor chip. By means of this two-step process for forming the concave portion 22, the extension portion 20 is formed.

Patterning by means of a photolithography method, for example, may also be performed. That is, the insulating material 20' is provided over the entire surface of the base 12 at an equal thickness to a sum d2 (=d1+d3) of the thickness d3 of the bottom surface portion 22a of the concave portion 22 and the thickness d1 of the semiconductor chip 30 following curing processing, for example. A region of the insulating material 20' corresponding to the semiconductor chip disposal region 14 on the base 12 is then removed by a well-known process such as masking, exposure, and development in an amount corresponding to the thickness d1 of the semiconductor chip 30 such that the set thickness d3 of the bottom surface portion 22a remains. As a result, a pattern of the insulating material 20' comprising the concave portion 22 is formed on the base 12.

Patterning of the insulating film 20' may also be performed in a one-step process. If a dispensing method is used, for example, the bottom surface portion of the concave portion 22 can be formed by reducing the discharge amount of the insulating material 20' on the base 12 during the formation of the bottom surface portion.

Patterning by means of a one-step process may also be performed when a printing method is applied, for example, by adjusting the amount of provided insulating material 20' while adjusting the distance between a mask and the base 12.

Figure 11B:
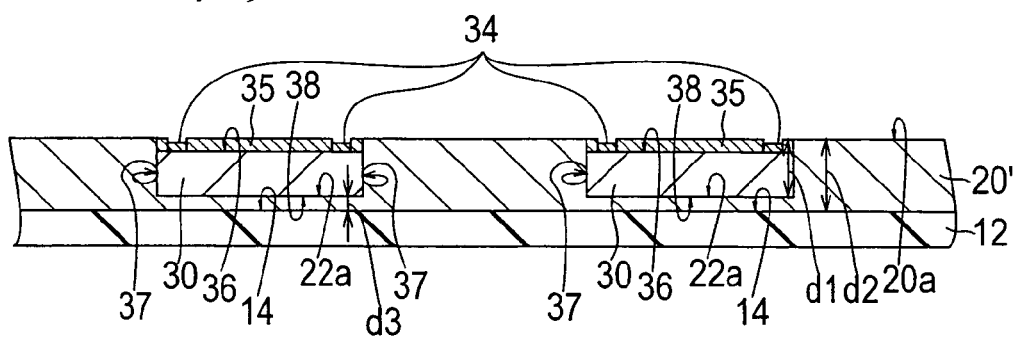

Next, as shown in FIG. 11(B), the semiconductor chip 30 is provided within the concave portion 22 of the patterned insulating material 20'.

A circuit element (not shown) having a predetermined function is provided on the semiconductor chip 30. The semiconductor chip 30 comprises the first main surface 36 and the second main surface 38 which opposes the first main surface 36. The semiconductor chip 30 also comprises the surface protecting film 35 on the first main surface 36 and one, two, or more side surfaces 37 which exist between the surface of the surface protecting film 35 and the second main surface 38. The surface protecting film 35 is constituted by an insulating material. The plurality of electrode pads 34 connected to the circuit element is formed on the first main surface 36 around the peripheral edge of the first main surface 36 such that at least a part thereof is exposed on the surface protecting film 35.

The semiconductor chip 30 is provided such that the second main surface 38 faces the bottom surface portion 22a of the concave portion 22. The semiconductor chip 30 is held by the viscosity of the insulating material 20' on the bottom surface portion 22a of the concave portion 22.

Here, the extension portion 20 is formed by applying curing processing such as heating or ultraviolet radiation, for example, to the selected insulating material 20' under favorable conditions. At this time, the insulating material 20' of the bottom surface portion 22a of the concave portion 22 which contacts the second main surface 38 of the semiconductor chip 30 is also cured. Thus the semiconductor chip 30 is adhered to and held on the base 12 via the bottom surface portion 22a.

The surfaces of the semiconductor chip 30 other than the surface protecting film 35, or in other words the side surfaces 37 and second main surface 38, are surrounded by the extension portion 20.

At this time, the level of the surface of the surface protecting film 35 is set to be substantially equal to the level of the first surface 20a of the extension portion 20 following curing processing.

Here, an example was described in which curing processing of the insulating material 20' is performed after the semiconductor chip 30 is provided within the concave portion. Using a photolithography method or the like as described above, however, the extension portion 20 may be formed by curing the pattern formed by the insulating material 20' before the semiconductor chip 30 is provided in the concave portion 22. In this case, the semiconductor chip 30 is provided within the concave portion 22 of the formed extension portion 20.

At this time, it is preferable that a type of adhesion means be provided on the bottom surface portion 22a of the concave portion 22. The semiconductor chip 30 may then be adhered to and held in the concave portion 22 by these adhesion means.

Figure 11C:
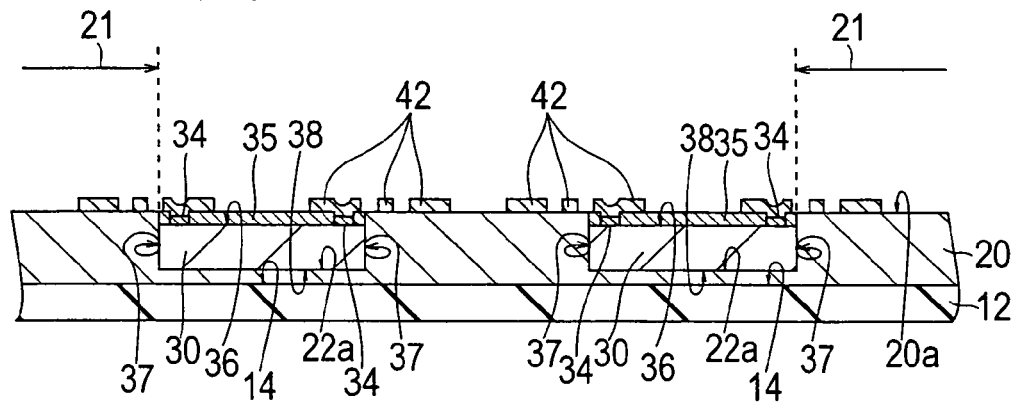

Next, as shown in FIG. 11(C), wiring patterns 42 comprising a plurality of wiring patterns are formed on the upper side of (directly above) the surface protecting film 35 and the upper side of (directly above) the first surface 20a of the extension portion 20, or in other words in the extended region 21.

The wiring patterns 42 may be formed by means of a wiring pattern formation process in a well-known WCSP manufacturing process such as sputtering or photolithography and using an appropriately selected material such as copper, aluminum, or a metal alloy, for example, so as to lead from the upper side of (directly above) the surface protecting film 35 to a region including the upper side of (directly above) the first surface 20a of the extension portion 20.

Figure 12A:
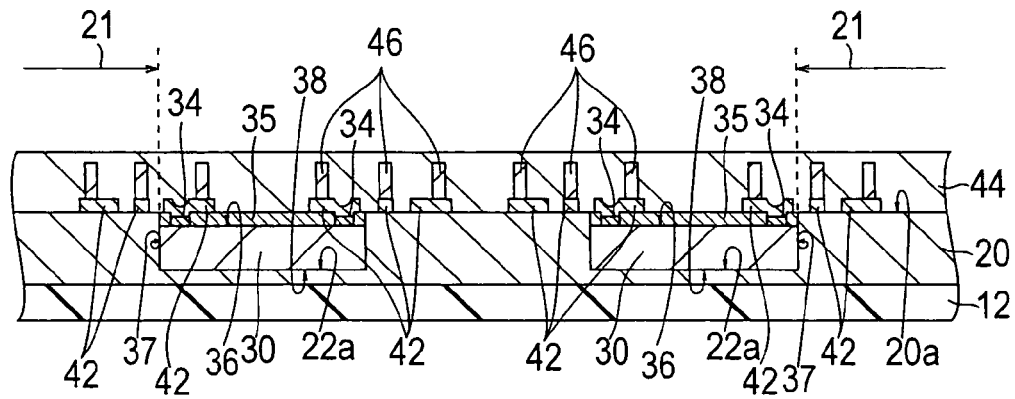
FIGS. 12(A), 12(B), and 12(C) are schematic sectional views (2) for illustrating the manufacturing method for the semiconductor device according to the second embodiment of this invention.

Next, as shown in FIG. 12(A), the plurality of electrode posts is formed in a lattice formation and at a predetermined pitch on the surface of each wiring pattern 42 in a region corresponding to the extension portion 20, or in other words a region including the extended region 21. The pitch of the plurality of electrode posts 46 may be set in consideration of mounting as described above, or in other words as either a constant or irregular pitch.

After an appropriate material has been selected, the electrode posts 46 may be formed by means of an electrode post 46 forming process in a well-known WCSP manufacturing process such as plating or photolithography.

The sealing portion 44 is then formed so as to cover the wiring patterns 42 and electrode posts 46 formed on the extension portion 20 and/or the semiconductor chip 30.

The sealing portion 44 forming step may be implemented by means of a well-known sealing method using a well-known sealing material such as an epoxy mold resin, for example.

Requirements such as the properties of the mold resin to be applied are similar to those of the first embodiment and therefore detailed description thereof has been omitted.

Examples of combinations of the properties of the mold resin used to form the extension portion 20 and sealing portion 44 are also similar to those of the first embodiment, and hence description thereof has been omitted.

Figure 12B:
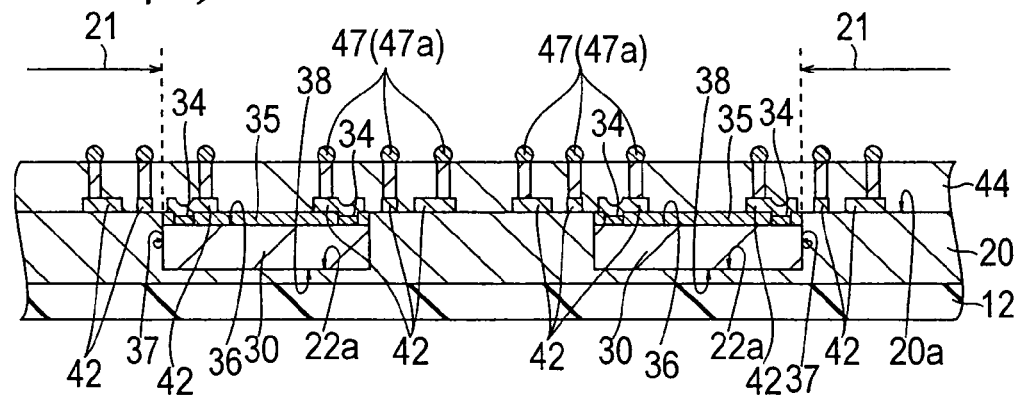

Next, as shown in FIG. 12(B), the surface side of the sealing portion 44 is trimmed such that the top surface (also referred to as the upper surface) of the electrode posts 46 is exposed.

This step is performed using a well-known grinding or polishing process.

Solder balls 47a, for example, serving as the external terminals 47 are then formed via the electrode posts 46 exposed on the surface of the sealing portion 44 on the upper surface thereof.

Figure 12C:
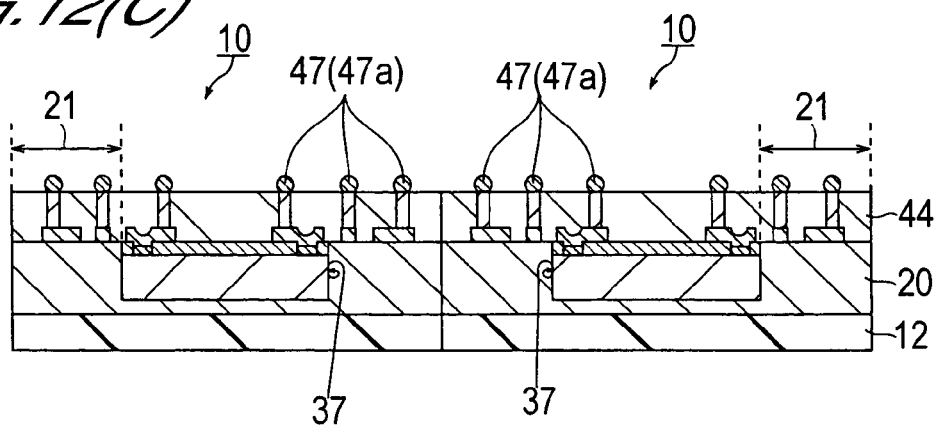

Next, as shown in FIG. 12(C), the plurality of semiconductor chips is severed to provide individual semiconductor devices comprising a semiconductor chip.

This singularization process is preferably performed by cutting using a blade which rotates at high speed.

According to the manufacturing method of the second embodiment, a semiconductor device 10 in which the second surface 38 side of the semiconductor chip 30 in particular is effectively protected by the extension portion 20 can be manufactured by means of a simple process.

Third Embodiment

A semiconductor device according to a third embodiment of this invention will now be described with reference to FIGS. 13(A) through 13(D). In addition to the constitution of the semiconductor devices 10 of the first and second embodiments described above, the semiconductor device 10 of the third embodiment has an insulating film 40 formed on a first surface 20a of an extension portion 20 and a surface protecting film 35 of a semiconductor chip 30. Inside walls 24 having an inclined form such that the extension portion 20 becomes gradually thinner toward the semiconductor chip 30 side are also provided.

Note that in the manufacturing process to be described below, applied materials, process implementation conditions, and so on are substantially identical to those described in the first embodiment, and hence detailed description thereof has been omitted. Note also that in each drawing, the plan view is similar to that described in the first embodiment, and hence illustration and detailed description thereof have been omitted.

Figure 13A:
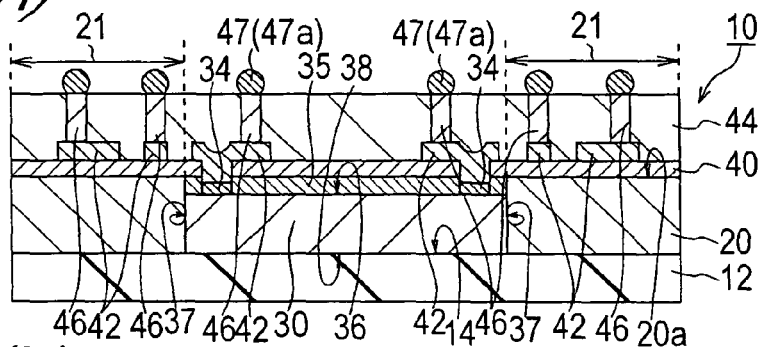
FIGS. 13(A), 13(B), 13(C), and 13(D) are schematic sectional views for illustrating a constitutional example of a semiconductor device according to a third embodiment of this invention.
Figure 13B:
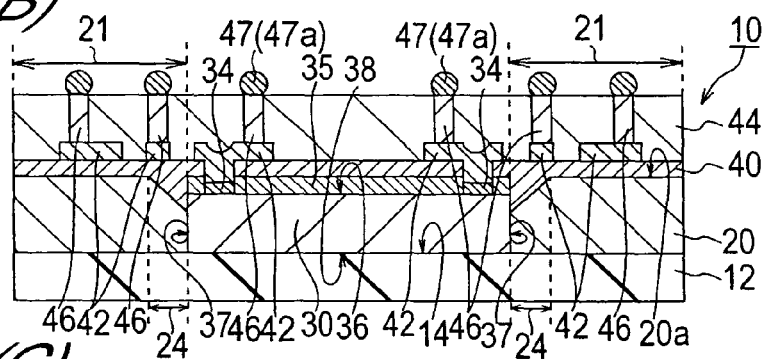
Figure 13C:
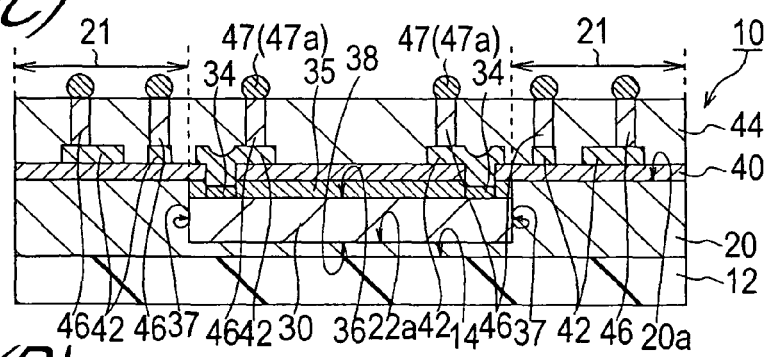
Figure 13D:
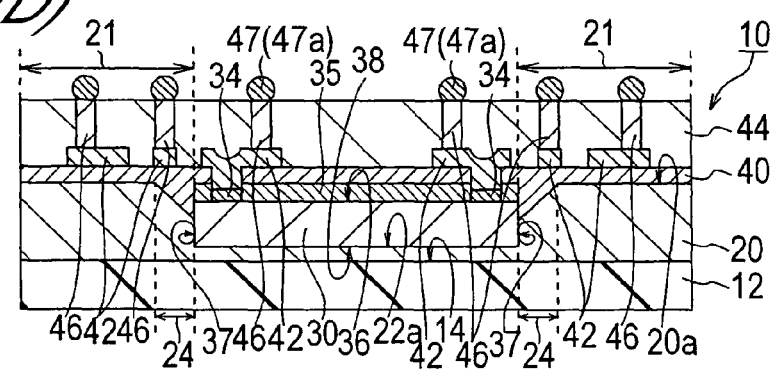

The semiconductor device according to the third embodiment of this invention will now be described with reference to FIGS. 13(A), (B), (C), and (D). FIGS. 13(A), (B), (C), and (D) are schematic sectional views of the semiconductor device of the third embodiment. FIG. 13(A) shows a constitutional example in which the insulating film 40 is provided on the semiconductor device of the first embodiment. FIG. 13(B) is a modified example of FIG. 13(A), showing a constitutional example comprising inside walls 24 having an inclined form such that the extension portion 20 becomes gradually thinner toward the semiconductor chip 30 side. FIG. 13 (C) shows a constitutional example in which the insulating film 40 is provided on the semiconductor device of the second embodiment. FIG. 13(D) is a modified example of FIG. 13(C), showing a constitutional example comprising the inside walls 24 having an inclined form such that the extension portion 20 becomes gradually thinner toward the semiconductor chip 30 side.

All of the semiconductor devices 10 according to the third embodiment of this invention comprise a base 12.

The extension portion 20 is formed on a semiconductor chip disposal region 14 on the base 12. In the constitutional example in FIGS. 13(A) and 13(B), the extension portion 20 is provided such that the semiconductor chip disposal region 14 is exposed. In the constitutional example in FIGS. 13(C) and 13(D), the extension portion 20 comprises a concave portion 22 in which a semiconductor chip is provided subsequently. The concave portion 22 comprises a bottom surface portion 22a which matches the profile of the semiconductor chip disposal region 14.

The semiconductor chip 30 is provided on the semiconductor chip disposal region 14 or within the concave portion 22.

As described above, the semiconductor chip 30 comprises a circuit element (not shown) having a predetermined function. The semiconductor chip 30 comprises a first main surface 36 and a second main surface 38 which opposes the first main surface 36. The semiconductor chip 30 also comprises a surface protecting film 35 on the first main surface 36 and one, two, or more side surfaces 37 which exist between the surface of the surface protecting film 35 and the second main surface 38. The surface protecting film 35 is constituted by an insulating material. A plurality of electrode pads 34 connected to the circuit element is formed on the first main surface 36 around the peripheral edge of the first main surface 36 such that at least a part thereof is exposed on the surface protecting film 35.

The semiconductor chip 30 is provided such that the first main surface 36 becomes the upper surface, or in other words such that the second main surface 38 faces the semiconductor chip disposal region 14 or the bottom surface portion 22a of the concave portion 22 in the extension portion 20.

Thus in the constitution shown in FIGS. 13(A) and 13(B), the extension portion 20 is provided surrounding the side surfaces 37 of the semiconductor chip 30. In the constitution shown in FIGS. 13(C) and 13(D), the extension portion 20 is provided surrounding the surfaces of the semiconductor chip 30 other than the surface of the surface protecting film 35, or in other words the side surfaces 37 and second main surface 38. At this time, the level of the surface of the surface protecting film 35 is set to be substantially equal to the level of a first surface 20a of the extension portion 20 following curing processing.

The requirements for forming the extension portion 20, such as the properties and so on of the material used therefor, are similar to those of the first and second embodiments and hence detailed description thereof has been omitted.

The insulating film 40 is formed on the first surface 20a of the extension portion 20 and the surface protecting film 35 of the semiconductor chip 30 such that the electrode pads 34 on the semiconductor chip 30 are exposed.

A plurality of wiring patterns 42 is formed on the insulating film 40. The wiring patterns 42 are electrically and regularly connected to electrode posts which are connected to the lower portion of external terminals 47, and the corresponding electrode pads 34. A long wire 42a, a medium wire 42b, and a short wire 42c, for example, are provided as the wires which constitute the wiring patterns 42. These wires 42a, 42b, and 42c are respectively connected to the corresponding electrode pads 34 in a one-on-one connection relationship of one wire to one electrode pad.

At least a part of the plurality of wiring patterns 42 is provided in a region on the upper side of (directly above) the semiconductor chip, or in other words electrically connected to the electrode pads 34 and leading therefrom to a region on the upper side of the extension portion 20.

The region on the upper side of (directly above) the extension portion 20 is referred to as an extended region 21 due to the fact that an external terminal forming region extends beyond the surface region of the semiconductor chip 30. In this constitutional example, the external terminals 47 are also formed in the extended region 21 via the electrode posts 46.

In this constitutional example, the external terminals 47 are formed using solder balls 47a, for example. The solder balls 47a are provided on the top surface of the electrode posts 46 and electrically connected to the wiring patterns 42 via the electrode posts 46. The arrangement and pitch of adjacent electrode posts 46 may be set as desired in consideration of mounting onto a printed board or the like, for example.

The wiring patterns 42 comprising a plurality of wiring patterns are formed on the surface of the insulating film 40 so as to be electrically connected to the exposed electrode pads 34.

The wiring patterns 42 may be formed in desired patterns in consideration of the output signals from the semiconductor chip 30, the disposal positions of the external terminals required by the semiconductor device 10, and so on.

In addition to the effects obtained in the first embodiment described above, according to the semiconductor device 10 of the third embodiment of this invention, when a height difference occurs between the surface of the extension portion 20 and the surface of the semiconductor chip 30, when the inside walls 24 are provided in an inclined form such that the extension portion 20 becomes gradually thinner toward the semiconductor chip 30 side, when an undulation or depression occurs on the surface of the extension portion 20, or in similar cases, the material for the insulating film 40 can be used to reduce the height difference, undulation, and/or depression to an extent at which wiring patterns can be formed subsequently, or to form the insulating film 40 evenly. As a result, the subsequent wiring pattern forming step and electrode post forming step can be performed with more stability, thereby improving the reliability of the semiconductor device 10.

Next, a manufacturing method for the semiconductor device of the third embodiment will be described with reference to FIGS. 14(A) through 15(C). Here, description is provided with the constitutional example shown in FIG. 13(D) as a representative and with comparison to the other constitutional examples.

Each drawing is a schematic sectional view illustrating a step in the manufacture of the semiconductor device of the third embodiment.

Semiconductor chip disposal regions 14 are set in advance on the base 12 in alignment with the outer dimensions of the semiconductor chips 30 to be applied. The intervals between adjacent semiconductor chip disposal regions 14 are set to be equal. This interval is determined in consideration of the margin surface area required in a subsequent singularization step, the surface area of the extension portion which is formed in accordance with the desired number of external terminals, and so on, for example.

Figure 14A:
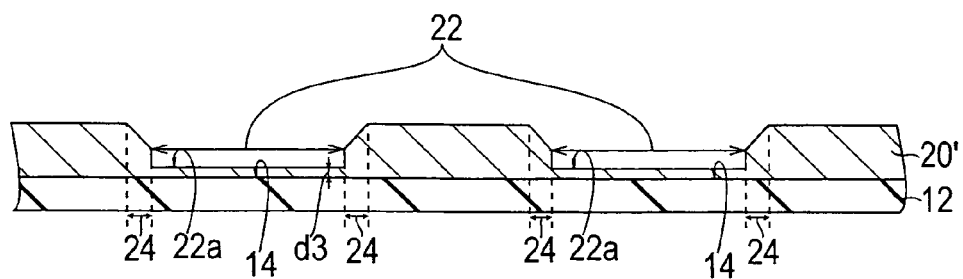
FIGS. 14(A), 14(B), and 14(C) are schematic sectional views (1) for illustrating a manufacturing method for the semiconductor device according to the third embodiment of this invention.

First, as shown in FIG. 14(A), insulating material 20' for forming the extension portion 20 is provided on the base 12. Requirements for the insulating material 20' such as properties and the like are similar to those of the first embodiment and hence detailed description thereof has been omitted.

The insulating material 20' is provided on the base 12 so as to form the concave portion 22 in which the semiconductor chip will be provided subsequently. The concave portion 22 is formed comprising the bottom surface portion 22a which matches the profile of the semiconductor chip disposal region 14 (i.e. matches the profile of the semiconductor chip to be disposed therein). A thickness d3 of the concave portion 22 on the bottom surface portion 22a side may be set appropriately in consideration of the thermal radiation property and so on of the semiconductor chip 30 to be provided subsequently, for example.

When the semiconductor device 10 is constituted as shown in FIGS. 13 (A) and 13(B), the semiconductor chip disposal region 14 is exposed on the base 12.

The applicable method for forming the extension portion 20 is as described in the first embodiment, and hence detailed description thereof has been omitted.

When the semiconductor device 10 is constituted as shown in FIGS. 13(C) and 13(D), as described in the first and second embodiments, the insulating material 20' is applied to the entire surface of the base 12 at an equal thickness to the thickness d3 of the concave portion 22 on the bottom surface portion 22a side using a dispensing method, precision printing method, photolithography method, or similar to thereby form the extension portion 20 comprising the concave portion 22 by means of a one-step or two-step process.

At this time, the inside walls 24 having an inclined form which becomes gradually thinner toward the semiconductor chip 30 side (i.e. toward the center of the concave portion 22) may be formed in the concave portion (opening portion) 22 of the extension portion 20 using the curing conditions of the curing process. The inside walls 24 may be formed using a standard curing process, for example. The inclined inside walls 24 may preferably be formed by heating the insulating material 20' to a higher temperature than is appropriate for initial curing and for an amount of time at which only the surface side of the material is cured, for example, and then curing the interior of the material (layer) at an appropriate temperature.

The inside walls 24 which become gradually thinner toward the semiconductor chip 30 side may also be formed by a masking, exposure, and development process in a photolithography method, for example. By forming the inclined inside walls 24 using a photolithography method, the angle of the incline may easily be set more precisely.

Figure 14B:
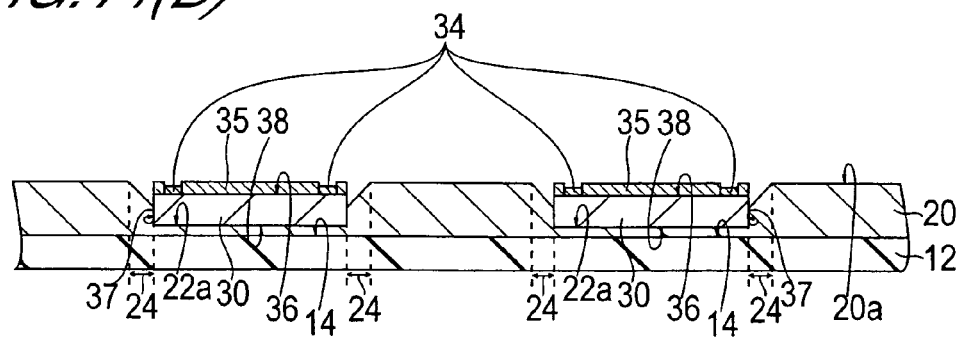

Next, as shown in FIG. 14(B), the semiconductor chip 30 is provided within the concave portion 22 of the extension portion 20 by sliding the semiconductor chip 30 along the surface of the inclined inside walls 24.

Note that when the semiconductor device 10 is constituted as shown in FIGS. 13(A) and 13(C), the insulating material 20' may be cured after the semiconductor chip 30 is provided such that the extension portion 20 is formed with the semiconductor chip 30 provided on the semiconductor chip disposal region 14 or in the concave portion 22.

Thus the surfaces of the semiconductor chip 30 other than the surface of the surface protecting film 35, or in other words the side surfaces 37 and second main surface 38, are surrounded by, and in contact with, the extension portion 20, as illustrated in FIG. 14(B). When the semiconductor device 10 is constituted as shown in FIGS. 13(A) and 13(C), the surfaces of the semiconductor chip 30 other than the surface of the surface protecting film 35 and the second main surface 38, or in other words the side faces 37, are surrounded by, and in contact with, the extension portion 20.

At this time, it is preferable that the level of the surface of the surface protecting film 35 be substantially equal to the level of the first surface 20a of the extension portion 20 following curing processing.

Next, the insulating film 40 is formed on the surface of the surface protecting film 35 and extension portion 20.

The insulating film 40 is formed such that the electrode pads 34 on the semiconductor chip 30 are exposed.

Here, the electrode pads 34 may be exposed using a photolithography method or the like after the insulating film 40 has been formed covering the electrode pads 34 or after the material of the insulating film 40 has been provided.

As described above, a height difference may occur on the boundary between the first surface 20a of the extension portion 20 and the surface protecting film 35 of the semiconductor chip 30. Also, an undulation or depression may occur on the first surface 20a of the extension portion 20. In such cases, the material for the insulating film 40 may be used to reduce the height difference to an extent at which the wiring patterns 42 may be formed subsequently, or to form the insulating film 40 evenly.

Formation of the insulating film 40 is preferably implemented using a suitable material which corresponds to the material and so on of the extension portion 20, and by selecting an appropriate method. For example, the insulating film 40 forming step may be implemented using a well-known method such as spin-coating, printing, or direct application.

Figure 14C:
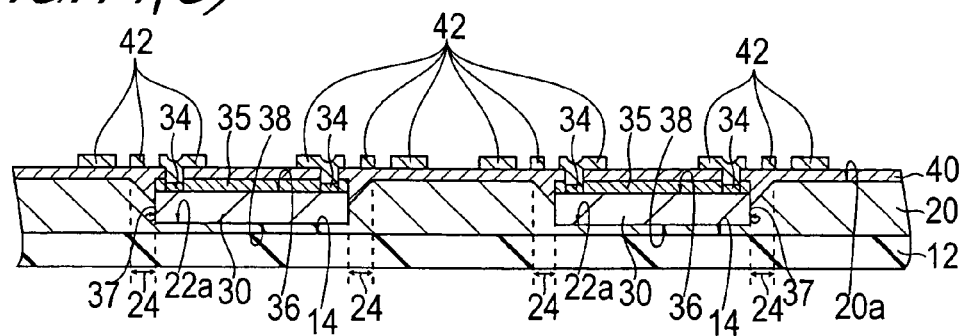

Next, as shown in FIG. 14(C), the plurality of wiring patterns 42 is formed on the surface of the insulating film 40.

The wiring patterns 42 may be formed so as to include patterns in a region leading from the upper side of (directly above) the surface protecting film 35 to the upper side of (directly above) the first surface 20a of the extension portion 20 by means of a wiring pattern formation process in a well-known WCSP manufacturing process such as sputtering or photolithography using an appropriately selected material such as copper, aluminum, or a metal alloy, for example.

Figure 15A:
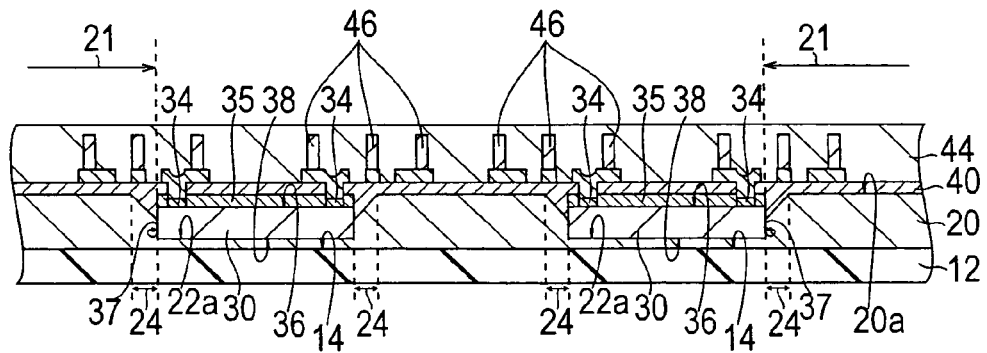
FIGS. 15(A), 15 (B), and 15(C) are schematic sectional views (2) for illustrating the manufacturing method for the semiconductor device according to the third embodiment of this invention.

Next, as shown in FIG. 15 (A), the plurality of electrode posts 46 is formed in a lattice formation and at a predetermined pitch on the surface of the wiring patterns 42 in a region corresponding to the upper side of (directly above) the extension portion 20, or in other words a region including the extended region 21. The pitch of the plurality of electrode posts 46 may be set in consideration of mounting as described above, or in other words as either a constant or irregular pitch.

After an appropriate material has been selected, the electrode posts 46 may be formed by means of an electrode post 46 forming process in a well-known WCSP manufacturing process such as plating or photolithography.

The sealing portion 44 is then formed so as to cover the wiring patterns 42 and electrode posts 46 formed on the extension portion 20 and/or the semiconductor chip 30.

The sealing portion 44 forming step may be implemented by means of a well-known sealing method using a well-known sealing material such as an epoxy mold resin, for example.

Requirements such as the properties of the mold resin to be applied are similar to those of the first embodiment and hence detailed description thereof has been omitted.

Examples of combinations of the properties of the mold resin used to form the extension portion 20 and sealing portion 44 are also similar to those of the first embodiment, and hence description thereof has been omitted.

Figure 15B:
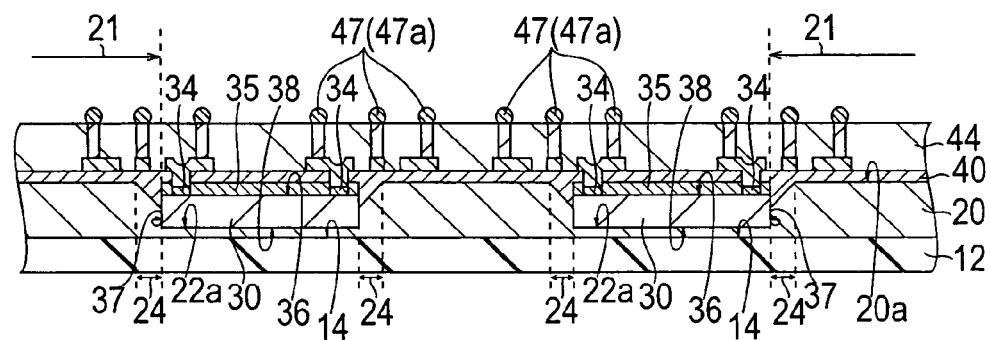

Next, as shown in FIG. 15(B), the surface side of the sealing portion 44 is trimmed such that the top surface (also referred to as the upper surface) of the electrode posts 46 is exposed.

This step is performed using a well-known grinding or polishing process.

Solder balls 47a, for example, serving as the external terminals 47 are then formed via the electrode posts 46 exposed on the surface of the sealing portion 44 on the upper surface thereof.

Figure 15C:
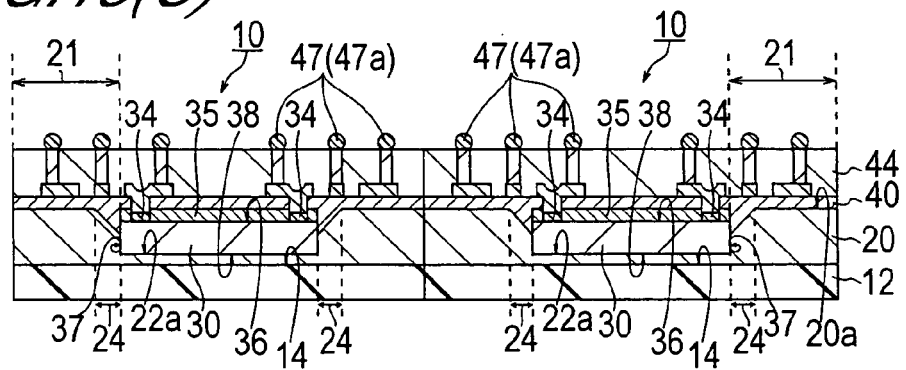

Next, as shown in FIG. 15(C), adjacent semiconductor chips are severed to provide individual constitutional bodies comprising a single semiconductor device which exhibits a predetermined function.

This singularization process is preferably performed by cutting using a blade which rotates at high speed.

According to the manufacturing method of the third embodiment, a semiconductor device 10 in which the second surface 38 side of the semiconductor chip 30 in particular is effectively protected by the extension portion 20 can be manufactured by means of a simple process.

A plurality of the semiconductor devices 10 of this invention may be stacked, for example. In this case, through holes may be formed in the extension portion 20 using a well-known method, for example, to thereby form stacking terminals.

In all embodiments of this invention, the electrode posts 46 are preferably formed from a conductive material such as aluminum or copper. The electrode posts 46 are preferably formed from copper. A thin oxidation layer is preferably formed on the surface of the electrode posts 46 at this time. In so doing, the adhesive property between the electrode posts 46 and the sealing portion 44 is improved, thereby improving resistance to moisture.

Further, in all embodiments of this invention the solder balls 47a are formed on the electrode posts 46 as the external terminals 47. A so-called BGA (Ball Grid Array) has been described, but this invention is not limited thereto. For example, a so-called LGA (Land Grid Array) constitution or the like is also possible.

More specifically, either a solder layer is formed directly on the surface of the exposed electrode posts 46, or a barrier metal layer is formed on the surface of the electrode posts 46 and then a gold (Au) plating layer is formed on the barrier metal layer. Alternatively, an Sn (tin) layer may be formed directly on the surface of the electrode posts 46 and used as an external terminal.

Further, in all embodiments of this invention the sealing portion may be formed not only in a so-called saw-cut form, but may also be formed not matching the profile of the base and/or the extension portion as long as the extent of this mismatch is within a range which does not impair the object of this invention.

What is claimed is:

1. A manufacturing method for a semiconductor device comprising:
   (a) setting a plurality of semiconductor chip disposal regions, each for one of a plurality of semiconductor chips to be disposed thereon, at a predetermined pitch on a base, each of the plurality of semiconductor chips having a first main surface with a plurality of electrode pads provided thereon, a surface protecting film formed on the first main surface and exposing the electrode pads, a second main surface opposite to the first main surface, and a plurality of side surfaces between a surface of the surface protecting film and the second main surface;
   (b) forming an extension portion from an insulating material such that a plurality of concave portions are formed on the base, each of the concave portions being defined by inside walls, with a bottom surface portion of each concave portion defined by a lowermost portion of the inside walls matching a profile of the second main surface of one of the plurality of semiconductor chips, the inside walls being gradually thinner towards a center of the concave portion;
   (c) providing the plurality of semiconductor chips each in a corresponding one of the plurality of concave portions, the second main surface thereof facing the bottom surface of the corresponding one concave portion, and the side surfaces thereof being in contact with the lowermost portion of the inside walls of the corresponding one concave portion;
   (d) forming wiring patterns extending from the electrode pads to a region including an upper side of the extension portion;
   (e) forming a plurality of external terminals over the wiring patterns in the region including the upper side of the extension portion; and
   (f) severing the plurality of semiconductor chips to form individual semiconductor devices each having one of the plurality of semiconductor chips.

2. A manufacturing method for a semiconductor device comprising:
   (a) setting a plurality of semiconductor chip disposal regions, each for one of a plurality of semiconductor chips to be disposed thereon, at a predetermined pitch on a base, each of the plurality of semiconductor chips having a first main surface with a plurality of electrode pads provided thereon, a surface protecting film formed on the first main surface and exposing the electrode pads, a second main surface opposite to the first main surface, and a plurality of side surfaces between a surface of the surface protecting film and the second main surface;
   (b) forming an extension portion from an insulating material such that a plurality of concave portions are formed on the base, each of the concave portions being defined by inside walls, with a bottom surface portion of each concave portion defined by a lowermost portion of the inside walls matching a profile of the second main surface of one of the plurality of semiconductor chips, the inside walls being gradually thinner towards a center of the concave portion;
   (c) providing the plurality of semiconductor chips each in a corresponding one of the plurality of concave portions, the second main surface thereof facing the bottom surface of the corresponding one concave portion, and the side surfaces thereof being in contact with the lowermost portion of the inside walls of the corresponding one concave portion;
   (d) forming wiring patterns extending from the electrode pads to a region including an upper side of the extension portion;
   (e) forming a plurality of electrode posts on each of a part of the wiring patterns on the extension portion;
   (f) forming a sealing portion on the wiring patterns and the electrode posts such that a top surface of the electrode posts is exposed;
   (g) forming external terminals on the top surface of the exposed electrode posts; and
   (h) severing the plurality of semiconductor chips to form individual semiconductor devices each having one of the plurality of semiconductor chips.

3. A manufacturing method for a semiconductor device comprising:
   (a) setting a plurality of semiconductor chip disposal regions, each for one of a plurality of semiconductor chips to be disposed thereon, at a predetermined pitch on a base, each of the plurality of semiconductor chips having a first main surface with a plurality of electrode pads provided thereon, a surface protecting film formed on the first main surface and exposing the electrode pads, a second main surface opposite to the first main surface, and a plurality of side surfaces between a surface of the surface protecting film and the second main surface;

(b) providing an insulating material such that a plurality of concave portions are provided on the base, each of the concave portions being defined by inside walls, with a bottom surface portion of each concave portion defined by a lowermost portion of the inside walls matching a profile of the second main surface of one of the plurality of semiconductor chips, the inside walls being gradually thinner towards a center of the concave portion;

(c) providing the plurality of semiconductor chips each in a corresponding one of the plurality of concave portions, the second main surface thereof facing the bottom surface of the corresponding one concave portion, and the side surfaces thereof being in contact with the lowermost portion of the inside walls of the corresponding one concave portion;

(d) forming an extension portion by curing the insulating material;

(e) forming an insulating film on the surface of the extension portion and the surface protecting film such that the electrode pads are exposed;

(f) forming wiring patterns extending from the electrode pads to a region including an upper side of the extension portion;

(g) forming a sealing portion on the insulating film on which the wiring patterns are formed such that a part of each of the wiring patterns positioned on the extension portion is exposed;

(h) forming a plurality of external terminals over the wiring patterns in the region including the upper side of the extension portion and connecting the external terminals to the wiring patterns; and (i) severing the plurality of semiconductor chips to form individual semiconductor devices each having one of the plurality of semiconductor chips.

4. A manufacturing method for a semiconductor device comprising:

(a) setting a plurality of semiconductor chip disposal regions, each for one of a plurality of semiconductor chips to be disposed thereon, at a predetermined pitch on a base, each of the plurality of semiconductor chips having a first main surface with a plurality of electrode pads provided thereon, a surface protecting film formed on the first main surface and exposing the electrode pads, a second main surface opposite to the first main surface, and a plurality of side surfaces between a surface of the surface protecting film and the second main surface;

(b) providing an insulating material such that a plurality of concave portions are provided on the base, each of the concave portions being defined by inside walls, with a bottom surface portion of each concave portion defined by a lowermost portion of the inside walls matching a profile of the second main surface of one of the plurality of semiconductor chips, the inside walls being gradually thinner towards a center of the concave portion;

(c) providing the plurality of semiconductor chips each in a corresponding one of the plurality of concave portions, the second main surface thereof facing the bottom surface of the corresponding one concave portion, and the side surfaces thereof being in contact with the lowermost portion of the inside walls of the corresponding one concave portion;

(d) forming an extension portion by curing the insulating material;

(e) forming an insulating film on the surface of the extension portion and the surface protecting film such that the electrode pads are exposed;

(f) forming wiring patterns extending from the electrode pads to a region including an upper side of the extension portion;

(g) forming a plurality of electrode posts on each of the part of the wiring patterns on the extension portion;

(h) forming a sealing portion on the wiring patterns and the electrode posts such that a top surface of the electrode posts is exposed;

(i) forming external terminals on the top surface of the exposed electrode posts; and (j) severing the plurality of semiconductor chips to form individual semiconductor devices each having one of the plurality of semiconductor chips.

* * * * *